United States Patent
Hashimoto et al.

(10) Patent No.: US 11,061,316 B2
(45) Date of Patent: Jul. 13, 2021

(54) MASK BLANK, TRANSFER MASK, METHOD OF MANUFACTURING A TRANSFER MASK, AND METHOD OF MANUFACTURING A SEMICONDUCTOR DEVICE

(71) Applicants: HOYA CORPORATION, Tokyo (JP); HOYA ELECTRONICS SINGAPORE PTE. LTD., Singapore (SG)

(72) Inventors: Masahiro Hashimoto, Tokyo (JP); Mariko Uchida, Singapore (SG); Isao Kawasumi, Singapore (SG)

(73) Assignees: HOYA CORPORATION, Tokyo (JP); HOYA ELECTRONICS SINGAPORE PTE. LTD., Singapore (SG)

( * ) Notice: Subject to any disclaimer, the term of this patent is extended or adjusted under 35 U.S.C. 154(b) by 298 days.

(21) Appl. No.: 16/463,202

(22) PCT Filed: Nov. 1, 2017

(86) PCT No.: PCT/JP2017/039518
§ 371 (c)(1),
(2) Date: May 22, 2019

(87) PCT Pub. No.: WO2018/100958
PCT Pub. Date: Jun. 7, 2018

(65) Prior Publication Data
US 2019/0369485 A1    Dec. 5, 2019

(30) Foreign Application Priority Data
Nov. 30, 2016  (JP) .............................. JP2016-232588

(51) Int. Cl.
*G03F 1/32*  (2012.01)
*G03F 7/20*  (2006.01)

(52) U.S. Cl.
CPC .............. *G03F 1/32* (2013.01); *G03F 7/2002* (2013.01)

(58) Field of Classification Search
CPC .................................. G03F 1/32; G03F 7/2002
USPC .............................................................. 430/5
See application file for complete search history.

(56) References Cited

U.S. PATENT DOCUMENTS

| | | |
|---|---|---|
| 2003/0047691 A1 | 3/2003 | Musil et al. |
| 2015/0338731 A1 | 11/2015 | Nozawa et al. |
| 2016/0291452 A1 | 10/2016 | Sasamoto et al. |
| 2018/0052387 A1 | 2/2018 | Nozawa et al. |
| 2018/0129130 A1 | 5/2018 | Shishido et al. |

FOREIGN PATENT DOCUMENTS

| | | |
|---|---|---|
| JP | 8-220731 A | 8/1996 |
| JP | 2004-537758 A | 12/2004 |
| JP | 2010-217514 A | 9/2010 |
| JP | 2014-137388 A | 7/2014 |
| JP | 2015-26059 A | 2/2015 |
| JP | 2016-18192 A | 2/2016 |
| JP | 2016-189002 A | 11/2016 |
| JP | 2016-191863 A | 11/2016 |
| WO | 2016/147518 A1 | 9/2016 |

OTHER PUBLICATIONS

International Search Report for PCT/JP2017/039518 dated Feb. 6, 2018 [PCT/ISA/210].

*Primary Examiner* — Christopher G Young
(74) *Attorney, Agent, or Firm* — Kilpatrick Townsend & Stockton LLP

(57) ABSTRACT

A mask blank that includes a thin film made of a material containing silicon and nitrogen for forming a transfer pattern on a transparent substrate. In conducting an X-ray photoelectron spectroscopy on a plurality of measurement locations in an inner region, which is a region excluding a vicinity region and a surface layer region of the thin film, in order to acquire an average value $PSi\_fi\_av$ of maximum peaks $PSi\_fi$ of photoelectron intensity of Si2p narrow spectrum and conducting an X-ray photoelectron spectroscopy on a plurality of measurement locations in the transparent substrate to acquire an average value $PSi\_sb\_av$ of maximum peaks $PSi\_sb$ of photoelectron intensity of Si2p narrow spectrum, $(PSi\_fi\_av)/(PSi\_sb\_av)$ is 1.08 or more.

27 Claims, 4 Drawing Sheets

MASK BLANK, TRANSFER MASK, METHOD OF MANUFACTURING A TRANSFER MASK, AND METHOD OF MANUFACTURING A SEMICONDUCTOR DEVICE

CROSS REFERENCE TO RELATED APPLICATIONS

This application is a National Stage of International Application No. PCT/JP2017/039518, filed on Nov. 1, 2017, which claims priority from Japanese Patent Application No. 2016-232588, filed on Nov. 30, 2016.

TECHNICAL FIELD

This invention relates to a mask blank, a transfer mask manufactured using the mask blank, and a method of manufacture thereof. Further, this invention relates to a method of manufacturing a semiconductor device using the transfer mask.

BACKGROUND ART

In a manufacturing process of a semiconductor device, photolithography is used to form a fine pattern. Multiple transfer masks are usually utilized in forming the fine pattern In miniaturization of a semiconductor device pattern, it is necessary to shorten the wavelength of an exposure light source used in the photolithography, in addition to miniaturization of a mask pattern formed on the transfer mask. In recent years, application of an ArF excimer laser (wavelength 193 nm) is increasing as an exposure light source in the manufacture of semiconductor devices.

A type of a transfer mask is a half tone phase shift mask. A molybdenum silicide (MoSi)-based material is widely used for a phase shift film of a half tone phase shift mask. However, it has been discovered recently that a MoSi-based film has low resistance to an exposure light of an ArF excimer laser (so-called ArF light fastness), as disclosed in Publication 1. In Publication 1, ArF light fastness is enhanced by subjecting a MoSi-based film after formation of a pattern under plasma treatment, UV irradiation treatment, or heat treatment to form a passivation film on a surface of the pattern of the MoSi-based film.

Publication 2 discloses a phase shift mask including an SiNx phase shift film, and Publication 3 describes that an SiNx phase shift film was confirmed as having high ArF light fastness. On the other hand, Publication 4 discloses a defect repairing technique where xenon difluoride ($XeF_2$) gas is supplied to a black defect portion of a light shielding film while irradiating the part with an electron beam to etch and remove the black defect portion (defect repair by irradiating charged particles such as an electron beam as above is hereafter simply referred to as EB defect repair).

PRIOR ART PUBLICATIONS

Patent Publications

[Publication 1]
Japanese Patent Application Publication 2010-217514
[Publication 2]
Japanese Patent Application Publication H03-220731
[Publication 3]
Japanese Patent Application Publication 2014-137388
[Publication 4]
PCT Application Japanese Translation Publication 2004-537758

SUMMARY OF INVENTION

Problem to be Solved by the Invention

In the case where a black defect was detected in a thin film pattern in a mask defect inspection that is carried out in manufacturing a transfer mask from a mask blank, the black defect portion is repaired. In recent years, there is an increasing use of an EB defect repair disclosed in Publication 4 for repairing the black defect portion. An EB defect repair is a technique where unexcited fluorine-based gas such as $XeF_2$ is supplied to a black defect portion of a thin film pattern while irradiating the black defect portion with an electron beam so as to change the black defect portion into volatile fluoride for its removal from the thin film pattern.

In this EB defect repair, however, it is difficult to irradiate an electron beam only on the black defect portion, and it is also difficult to supply unexcited fluorine-based gas only to the black defect portion. When an EB defect repair is performed, a surface of a transparent substrate near the black defect portion is relatively likely to be affected by the EB defect repair. Therefore, a sufficient repair rate ratio to EB defect repair is considered as necessary between the transparent substrate and the thin film pattern.

A thin film of an SiN-based material has a composition that is closer to a transparent substrate made of a glass material compared to a thin film of a MoSi-based material. Therefore, it is difficult to enhance the repair rate ratio of a thin film of an SiN-based material relative to a transparent substrate to an EB defect repair. A phase shift film should have a function to transmit an exposure light at a predetermined transmittance and a function to generate a predetermined phase difference between the exposure light transmitted through the phase shift film and the exposure light transmitted through the air for a same distance as a thickness of the phase shift film. Further, it is expected to achieve a phase shift film having both of the above functions with less thickness. A thin film consisting of Si has a small refractive index n relative to an exposure light, and to generate a predetermined phase difference with this thin film, it is necessary for the thin film to have a significantly large thickness. The thin film of an SiN-based material tends to have more refractive index n as nitrogen content increases. For such a reason, it is necessary to contain more nitrogen in the case of forming the phase shift film from an SiN-based material. However, a thin film of an SiN-based material containing a large amount of nitrogen has a significantly slow repair rate of an EB defect repair, causing a problem of digging of a surface of the transparent substrate being likely to advance upon the EB defect repair.

On the other hand, a light shielding film of a binary mask is required have a predetermined value or less reflectance to an exposure light. In the case of forming a light shielding film having a low reflectance to an exposure light from an SiN-based material, it is necessary that at least a surface layer contains a large amount of nitrogen. Further, an SiN-based material with less nitrogen content tends to be relatively easily etched by fluorine-based gas of an unexcited condition. When an EB defect repair is carried out on a light shielding film pattern made of such an SiN-based material with less nitrogen content, a side wall of the light shielding film pattern that has not been irradiated with an electron beam may be etched with fluorine-based gas in an unexcited condition. Therefore, a predetermined amount or more nitrogen should be included in the case of a light shielding film of an SiN-based material as well. For the above reason, it had been a problem of slow repair rate of an EB defect repair and relatively easier advancement of digging in a surface of a transparent substrate upon an EB defect repair when a light shielding film is made from an SiN-based material, in the case of a binary mask as well.

This invention was made to solve the conventional problems in which, in a mask blank having a thin film for forming a transfer pattern in a transparent substrate, providing a mask blank having a sufficiently fast repair rate of an EE defect repair and having sufficiently high repair rate to an EB defect repair between a transparent substrate, even if the thin film was made of a material containing silicon and nitrogen. Another object of this invention is to provide a transfer mask using the mask blank and a manufacturing method thereof. Further object of this invention is to provide a method of manufacturing a semiconductor device using the transfer mask.

Means for Solving the Problem

For solving the above problem, this invention includes the following configurations.

Configuration 1

A mask blank including a thin film for forming a transfer pattern on a transparent substrate, in which:

the thin film is made of a material containing silicon and nitrogen, and in setting a plurality of measurement locations in a thickness direction of an inner region which is a region excluding a vicinity region of an interface of the thin film with the transparent substrate and a surface layer region opposite from the transparent substrate, conducting an X-ray photoelectron spectroscopy to acquire a maximum peak $PSi\_fi$ of photoelectron intensity of Si2p narrow spectrum for each of the plurality of measurement locations of the inner region, acquiring an average value $PSi\_fi\_av$ of the maximum peaks $PSi\_fi$ that are each acquired, setting a plurality of measurement locations in the transparent substrate in a thickness direction, conducting an X-ray photoelectron spectroscopy to acquire a maximum peak $PSi\_sb$ of photoelectron intensity of Si2p narrow spectrum for each of the plurality of measurement locations of the transparent substrate, and acquiring an average value $PSi\_sb\_av$ of the maximum peaks $PSi\_sb$ that are each acquired, the average value $PSi\_fi\_av$ of the thin film divided by the average value $PSi\_sb\_av$ of the transparent substrate $(PSi\_fi\_av)/(PSi\_sb\_av)$ is 1.08 or more.

Configuration 2

A mask blank according to Configuration 1 in which:

in setting a plurality of measurement locations in the surface layer region in a thickness direction, conducting an X-ray photoelectron spectroscopy to acquire a maximum peak $PSi\_fs$ of photoelectron intensity of Si2p narrow spectrum for each of the plurality of measurement locations of the surface layer region, and acquiring an average value $PSi\_fs\_av$ of the maximum peaks $PSi\_fs$ that are each acquired, the average value $PSi\_fs\_av$ in the surface layer region divided by the average value $PSi\_sb\_av$ of the transparent substrate $(PSi\_fs\_av)/(PSi\_sb\_av)$ is 1.05 or more.

Configuration 3

A mask blank according to Configuration 1 or 2, in which:

in setting a plurality of measurement locations in the surface layer region in a thickness direction, conducting an X-ray photoelectron spectroscopy to acquire a maximum peak $PN\_fs$ of photoelectron intensity of N1s narrow spectrum for each of the plurality of measurement locations of the surface layer region, acquiring an average value $PN\_fs\_av$ of the maximum peaks $PN\_fs$ that are each acquired, setting a plurality of measurement locations in the inner region in a thickness direction, conducting an X-ray photoelectron spectroscopy to acquire a maximum peak $PN\_fi$ of photoelectron intensity of N1s narrow spectrum for each of the plurality of measurement locations of the inner region, and acquiring an average value $PN\_fi\_av$ of the maximum peaks $PN\_fi$ that are each acquired, the average value $PN\_fs\_av$ in the surface layer region divided by the average value $PN\_fi\_av$ of the thin film $(PN\_fs\_av)/(PN\_fi\_av)$ is 0.98 or less.

Configuration 4

The mask blank according to any one of Configurations 1 to 3 in which a nitrogen content in the inner region is 50 atom % or more.

Configuration 5

The mask blank according to any one of Configurations 1 to 4 in which the surface layer region has more oxygen content than the inner region.

Configuration 6

The mask blank according to any one of Configurations 1 to 5, in which the maximum peak of photoelectron intensity of Si2p narrow spectrum is a maximum peak within a range of 96 [eV] or more and 106 [eV] or less binding energy.

Configuration 7

The mask blank according to Configuration 3, in which the maximum peak of photoelectron intensity of N1s narrow spectrum is a maximum peak within a range of 392 [eV] or more and 402 [eV] or less binding energy.

Configuration 8

The mask blank according to any one of Configurations 1 to 7, in which an X-ray to be irradiated on the thin film in the X-ray photoelectron spectroscopy is an AlKα ray.

Configuration 9

The mask blank according to any one of Configurations 1 to 8, in which the surface layer region is a region ranging from a surface opposite from the transparent substrate of the thin film up to a depth of 10 nm toward the transparent substrate.

Configuration 10

The mask blank according to any one of Configurations 1 to 9, in which the vicinity region is a region ranging from an interface with the transparent substrate up to a depth of 10 nm toward the surface layer region.

Configuration 11

The mask blank according to any one of Configurations 1 to 10 in which the thin film is a phase shift film.

Configuration 12

The mask blank according to Configuration 11, in which the phase shift film has a function to transmit an exposure light of an ArF excimer laser at a transmittance of 10% or more, and a function to generate a phase difference of 150 degrees or more and 200 degrees or less between the exposure light transmitted through the phase shift film and the exposure light transmitted through air for a same distance as a thickness of the phase shift film.

Configuration 13

A method of manufacturing a transfer mask using the mask blank according to any one of Configurations 1 to 12, including the step of forming transfer pattern in the thin film by dry etching.

Configuration 14

A transfer mask including a thin film having a transfer pattern on a transparent substrate, in which:
the thin film is made of a material containing silicon and nitrogen, and
in setting a plurality of measurement locations in a thickness direction of an inner region which is a region excluding a vicinity region of an interface of the thin film with the transparent substrate and a surface layer region opposite from the transparent substrate, conducting an X-ray photoelectron spectroscopy to acquire a maximum peak $PSi\_fi$ of photoelectron intensity of Si2p narrow spectrum for each of the plurality of measurement locations of the inner region, acquiring an average value $PSi\_fi\_av$ of the maximum peaks $PSi\_fi$ that are each acquired, setting a plurality of measurement locations in the transparent substrate in a thickness direction, conducting an X-ray photoelectron spectroscopy to acquire a maximum peak $PSi\_sb$ of photoelectron intensity of Si2p narrow spectrum for each of the plurality of measurement locations of the transparent substrate, and acquiring an average value $PSi\_sb\_av$ of the maximum peaks $PSi\_sb$ that are each acquired, the average value $PSi\_fi\_av$ of the thin film divided by the average value $PSi\_sb\_av$ of the transparent substrate $(PSi\_fi\_av)/(PSi\_sb\_av)$ is 1.08 or more.

Configuration 15

The transfer mask according to Configuration 14, in which:
in setting a plurality of measurement locations in the surface layer region in a thickness direction, conducting an X-ray photoelectron spectroscopy to acquire a maximum peak $PSi\_fs$ of photoelectron intensity of Si2p narrow spectrum for each of the plurality of measurement locations of the surface layer region, and acquiring an average value $PSi\_fs\_av$ of the maximum peaks $PSi\_fs$ that are each acquired, the average value $PSi\_fs\_av$ in the surface layer region divided by the average value $PSi\_sb\_av$ of the transparent substrate $(PSi\_fs\_av)/(PSi\_sb\_av)$ is 1.05 or more.

Configuration 16

The transfer mask according to Configuration 14 or 15, in which:
in setting a plurality of measurement locations in the surface layer region in a thickness direction, conducting an X-ray photoelectron spectroscopy to acquire a maximum peak $PN\_fs$ of photoelectron intensity of N1s narrow spectrum for each of the plurality of measurement locations of the surface layer region, acquiring an average value $PN\_fs\_av$ of the maximum peaks $PN\_fs$ that are each acquired, setting a plurality of measurement locations in the inner region in a thickness direction, conducting an X-ray photoelectron spectroscopy to acquire a maximum peak $PN\_fi$ of photoelectron intensity of N1s narrow spectrum for each of the plurality of measurement locations of the inner region, and acquiring an average value $PN\_fi\_av$ of the maximum peaks $PN\_fi$ that are each acquired, the average value $PN\_fs\_av$ in the surface layer region divided by the average value $PN\_fi\_av$ of the thin film $(PN\_fs\_av)/(PN\_fi\_av)$ is 0.98 or less.

Configuration 17

The transfer mask according to any one of Configurations 14 to 16 in which a nitrogen content in the inner region is 50 atom % or more.

Configuration 18

The transfer mask according to any one of Configurations 14 to 17 in which the surface layer region has more oxygen content than the inner region.

Configuration 19

The transfer mask according to any one of Configurations 14 to 18, in which the maximum peak of photoelectron intensity of Si2p narrow spectrum is a maximum peak within a range of 96 [eV] or more and 106 [eV] or less binding energy.

Configuration 20

The transfer mask according to Configuration 16, in which the maximum peak of photoelectron intensity of N1s narrow spectrum is a maximum peak within a range of 392 [eV] or more and 402 [eV] or less binding energy.

Configuration 21

The transfer mask according to any one of Configurations 14 to 20, in which an X-ray irradiated on the thin film in the X-ray photoelectron spectroscopy is an AlKα ray.

Configuration 22

The transfer mask according to any one of Configurations 14 to 21, in which the surface layer region is a region ranging from a surface opposite from the transparent substrate of the thin film up to a depth of 10 nm toward the transparent substrate.

Configuration 23

The transfer mask according to any one of Configurations 14 to 22, in which the vicinity region is a region ranging from an interface with the transparent substrate up to a depth of 10 nm toward the surface layer region.

Configuration 24

The transfer mask according to any one of Configurations 14 to 23 in which the thin film is a phase shift film.

Configuration 25

The transfer mask according to Configuration 24, in which the phase shift film has a function to transmit an exposure light of an ArF excimer laser at a transmittance of 10% or more, and a function to generate a phase difference of 150 degrees or more and 200 degrees or less between the exposure light transmitted through the phase shift film and the exposure light transmitted through air for a same distance as a thickness of the phase shift film.

Configuration 26

A method of manufacturing a semiconductor device including the step of exposure-transferring a transfer pattern in a resist film on a semiconductor substrate using the transfer mask manufactured by the method of manufacturing a transfer mask according to Configuration 13.

Configuration 27

A method of manufacturing a semiconductor device including the step of exposure-transferring a transfer pattern in a resist film on a semiconductor substrate using the transfer mask according to any one of Configurations 14 to 25.

Effect of the Invention

The mask blank of this invention includes a thin film for forming a transfer pattern on the transparent substrate, the thin film is made of a material containing silicon and nitrogen, and in setting a plurality of measurement locations in a thickness direction of an inner region which is a region excluding a vicinity region of an interface of the thin film with the transparent substrate and a surface layer region opposite from the transparent substrate, conducting an X-ray photoelectron spectroscopy to acquire maximum peaks $PSi\_fi$ of photoelectron intensity of Si2p narrow spectrum of the plurality of measurement locations of the inner region and an average value $PSi\_fi\_av$ of the maximum peaks $PSi\_fi$, setting a plurality of measurement locations in the transparent substrate in a thickness direction, and conducting an X-ray photoelectron spectroscopy to acquire maximum peaks $PSi\_sb$ of photoelectron intensity of Si2p narrow spectrum of the plurality of measurement locations of the transparent substrate and an average value $PSi\_sb\_av$ of the maximum peaks $PSi\_sb$, $(PSi\_fi\_av)/(PSi\_sb\_av)$ is 1.08 or more. By creating a mask blank having the above structure, a repair rate of the thin film to an EB defect repair can be accelerated and a repair rate ratio to an EB defect repair between the thin film and the transparent substrate can be enhanced.

Further, the transfer mask and its manufacturing method of this invention is featured in that in the transfer mask, a thin film having a transfer pattern has the same configuration as the thin film of the mask blank of this invention. Such a transfer mask can prevent excessive digging in the surface of the transparent substrate near the black defect, even if an EB defect repair was performed on a black defect portion of a thin film pattern upon manufacture of the transfer mask. Therefore, the transfer mask and the transfer mask manufactured by the manufacturing method of this invention result in a transfer mask with a high transfer precision.

EMBODIMENTS FOR CARRYING OUT THE INVENTION

Figure 1:
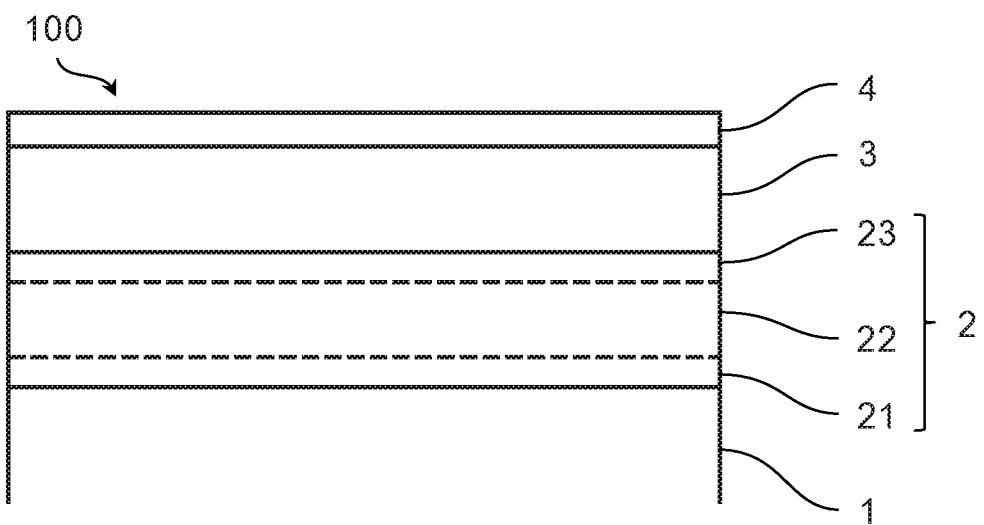
FIG. 1 is a cross-sectional view showing a configuration of a mask blank of an embodiment of this invention.

First, the sequence that derived the completion of this invention is described. The inventors of this invention made a diligent study on means for accelerating a repair rate of an EB defect repair when a thin film of a mask blank was formed using an SiN-based material, particularly a high nitrided SiN-based material with 50 atom % or more nitrogen content.

$XeF_2$ gas used for an EB defect repair is known as etching gas of an unexcited condition in conducting an isotropic etching on a silicon-based material. This etching is carried out through the process of surface adsorption of $XeF_2$ gas in an unexcited condition on a silicon-based material, separation into Xe and F, and generation of high order fluoride of silicon and its volatilization. In an EB defect repair on a thin film pattern of a silicon-based material, fluorine-based gas in an unexcited condition such as $XeF_2$ is supplied to a black defect portion of the thin film pattern, the fluorine-based gas is adsorbed to a surface of the black defect portion, and an electron beam is irradiated on the black defect portion. Thus, silicon atoms of the black defect portion are excited so that bonding with fluorine is promoted, forming high order fluoride of silicon and are volatilized significantly faster than when an electron beam is not irradiated. Since it is difficult to prevent the fluorine-based gas from being adsorbed on the thin film pattern around the black defect portion, the thin film pattern around the black defect portion is etched upon the EB defect repair. Therefore, it is important to significantly accelerate an etching rate (repair rate) of the black defect portion to an EB defect repair, and to enlarge as much as possible the difference between the repair rate and the etching rate (unexcited gas etching rate) of the thin film pattern other than the black defect portion to fluorine-based gas in an unexcited condition.

However, in performing an EB defect repair on a thin film pattern of an SiN-based material, it is difficult to significantly accelerate the rate at which high order fluoride of silicon is generated in the black defect portion (repair rate) even if an electron beam is irradiated on the black defect portion. While the repair rate of the black defect portion can be accelerated by significantly decreasing the nitrogen content in the thin film pattern of an SiN-based material, since a degree of freedom of the optical characteristics of the thin film pattern is significantly limited, the problem cannot be regarded as solved. Further, in the case where a nitrogen content in the thin film of an SiN-based material is significantly reduced, an unexcited gas etching rate of the thin film pattern also accelerates so that there is not much difference with the repair rate of the black defect portion.

On the other hand, in conducting an EB defect repair on a thin film pattern, fluorine-based gas in an unexcited condition is adsorbed also on a surface of the transparent substrate exposed by removal of the thin film when the thin film pattern was formed by dry etching. Further, it is difficult to irradiate an electron beam only on the black defect portion, and the surface of the exposed transparent substrate in the vicinity thereof is also irradiated with the electron beam. A transparent substrate of a transfer mask is generally made of a glass material containing silicon and oxygen as major ingredients such as synthetic quarts. A glass material has high durability to an etching rate (unexcited gas etching rate) to fluorine-based gas in an unexcited condition. However, when the repair rate of the black defect portion of the thin film pattern is slow, a surface of the transparent substrate to which fluorine-based gas in an unexcited condition is adsorbed will be subjected to an electron beam irradiation for a long period of time. Silicon in the transparent substrate locally contains silicon with a rather weak bond with other elements. A long term irradiation of an electron beam to such silicon causes their excitation, so that high order fluoride of silicon is produced and is volatilized (etched). Such a local etching on a surface of the transparent substrate causes irregularities on the surface, resulting in significant reduction in transfer performance of the transfer mask after the EB defect repair.

As a result of diligent studies, the inventors of this invention reached an idea that by using an SiN-based material where silicon easily excites when irradiated with an electron beam among SiN-based materials for a thin film pattern, it may be possible to reduce an unexcited gas etching rate of the thin film pattern while further increasing the repair rate of a black defect portion. The repair rate of a black defect portion of a thin film of an SiN-based material and an unexcited gas etching rate of a thin film pattern vary in accordance with a nitrogen content of the thin film. Further, a tendency of variation of a repair rate of a black defect portion due to a nitrogen content of a thin film and a tendency of variation of an unexcited gas etching rate of a thin film pattern are not always completely identical. Unless a thin film of an SiN-based material is formed on a transparent substrate, a pattern including a black defect portion is formed in the thin film, and further conducting an EB defect repair, it is difficult to determine whether there is a sufficient difference between the repair rate of the black defect portion of the thin film and the unexcited gas etching rate of the thin film pattern.

The inventors of this invention came up with an idea of applying an X-ray photoelectron spectroscopy (XPS) for an index to see whether silicon in a thin film of an SiN-based material is under the condition that is likely to excite when the thin film is irradiated with an electron beam. Initially, an inspection was made where a thin film of an SiN-based material is subjected to an X-ray photoelectron spectroscopy to acquire Si2p narrow spectrum, and using the difference in maximum peaks as an index. The maximum peak of photoelectron intensity of Si2p narrow spectrum in the thin film of an SiN-based material corresponds to the number per unit time of photoelectrons discharged from an Si—N bond. Photoelectron is an electron that was excited by being irradiated with an X-ray and ejected out from an atomic orbit. A material having a large number of photoelectrons discharged when irradiated with an X-ray and that is likely to excite is a material with a small work function. Such an SiN-based material with small work function is considered as a material that easily excites when irradiated with an electron beam.

However, information of an extremely small depth is all that can be obtained from Si2p narrow spectrum that is acquired by subjecting a surface of a thin film to X-ray photoelectron spectroscopy. Further, since the number of photoelectrons detected by an X-ray photoelectron spectroscopy varies in the same thin film of an SiN-based material due to measurement conditions (types of X-ray to be used, irradiation intensity, etc.), it cannot be used directly as an index. As a result of further diligent studies to solve these problems, the inventors reached an idea of setting a plurality of measurement locations in a thin film of an SiN-based material in the thickness direction, acquiring a maximum peak of photoelectron intensity of Si2p narrow spectrum for each measurement location, calculating the average value of the plurality of maximum peaks, setting a plurality of measurement locations in the transparent substrate beneath the thin film of an SiN-based material in the thickness direction, acquiring a maximum peak of photoelectron intensity of Si2p narrow spectrum for each measurement location, calculating the average value of the plurality of maximum peaks, dividing the average value of the maximum peak of the thin film of an SiN-based material by the average value of the maximum peak of the transparent substrate, and using the obtained value as an index.

The transparent substrate is made of a relatively stable material including $SiO_2$ as a main component. The transparent substrate used for a mask blank is required have an extremely small variation in the material, such as small variation in optical characteristics. Therefore, variation in work function of each material is also extremely small between a plurality of transparent substrates. In the case of the same measurement conditions, since a difference in the maximum peaks of photoelectron intensity of Si2p narrow spectrum between different transparent, substrates is small, influence of the difference in the measurement condition is significantly reflected on the maximum peak of photoelectron intensity. While the maximum peak of photoelectron intensity of Si2p narrow spectrum of the transparent substrate is a number per unit time of photoelectrons discharged from an Si—O bond, it is a preferable reference value to correct the difference in maximum peaks of photoelectron intensity of Si2p narrow spectrum in a thin film of an SiN-based material due to the difference in measurement conditions.

On the other hand, when a mask blank provided with a thin film of an SiN-based material in contact with a transparent-substrate is subjected to an X-ray photoelectron spectroscopy, a region in vicinity of an interface of the thin film with the transparent substrate (substrate vicinity region) is likely to be affected by the material of the transparent substrate, and the value of Si2p narrow spectrum is not precise. Further, a region in vicinity of a surface that is opposite from the transparent substrate side of the thin film (surface layer region) has oxygen incorporated therein, and there is a large difference in the value of Si2p narrow spectrum between a region internal of the unaffected thin film. Further, since an area occupied by the substrate vicinity region and the surface layer region in the entire thin film is small, there is relatively less influence on the repair rate of an EB defect repair.

As a result of a further diligent study, the inventors of this invention reached a conclusion that, in a mask blank where a thin film for forming a transfer pattern on a transparent substrate is made of a material containing silicon and nitrogen, when the thin film and the transparent substrate are subjected to an X-ray photoelectron spectroscopy, and when an average value of maximum peaks of photoelectron intensity of Si2p narrow spectrum in an inner region which is a region excluding a vicinity region of an interface of the thin film with the transparent substrate and a surface layer region divided by an average value of maximum peaks of photoelectron intensity of Si2p narrow spectrum of the transparent substrate is 1.08 or more, the repair rate of the thin film to an EB defect repair can be significantly accelerated, and the difference between the repair rate and an unexcited gas etching rate can be increased.

Namely, the mask blank of this invention is featured in including a thin film for forming a transfer pattern on a transparent substrate, the thin film is made of a material containing silicon and nitrogen, a plurality of measurement locations is set in a thickness direction of an inner region which is a region excluding a vicinity region of an interface of the thin film with the transparent substrate and a surface layer region opposite from the transparent substrate, an X-ray photoelectron spectroscopy is conducted to acquire a maximum peak PSi_fi of photoelectron intensity of Si2p narrow spectrum for each of the plurality of measurement locations of the inner region, an average value PSi_fi_av of maximum peaks PSi_fi is acquired, a plurality of measurement locations is set in the transparent substrate in the thickness direction, an X-ray photoelectron spectroscopy is conducted to acquire a maximum peak PSi_sb of photoelectron intensity of Si2p narrow spectrum in each of the plurality of measurement locations of the transparent substrate, an average value PSi_sb_av of maximum peaks PSi_sb is acquired, and the value obtained by (PSi_fi_av)/(PSi_sb_av) is 1.03 or more.

Next, each embodiment for carrying out this invention is explained. The mask blank of this invention is applicable to a mask blank for making various masks such as a binary mask and a phase shift mask. A mask blank for manufacturing a half tone phase shift mask will be explained below. FIG. 1 is a cross-section showing a configuration of a mask blank 100 according to an embodiment of this invention. The mask blank 100 of FIG. 1 has a structure where a phase shift film (thin film for forming a transfer pattern) 2, a light shielding film 3, and a hard mask film 4 are stacked in this order on a transparent substrate 1.

The transparent substrate 1 can be made from glass materials such as quartz glass, aluminosilicate glass, soda-lime glass, low thermal expansion glass ($SiO_2$—$TiO_2$ glass, etc.), in addition to synthetic quartz glass. Among these materials, synthetic quartz glass has high transmittance to ArF excimer laser light (wavelength: 193 nm), which is particularly preferable as a material for forming a transparent substrate of a mask blank.

To efficiently exhibit the phase shifting effect, the phase shift film 2 is required to have a transmittance to exposure light of ArF excimer laser (hereafter ArF exposure light) of preferably 1% or more, more preferably 2% or more, even more preferably 15% or more, and further more preferably 15% or more. Further, the phase shift film 2 is preferably adjusted so that a transmittance to ArF exposure light is 30% or less, and preferably 20% or less.

In recent years, NTD (Negative Tone Development) is being used as exposure/development processes to a resist film on a semiconductor substrate (wafer), in which a bright field mask (transfer mask having a high pattern opening rate) is often used. In a bright field phase shift mask, a phase shift film having 10% or more transmittance to an exposure light provides a better balance between 0-order light and first-order light of light transmitted through a light transmitting portion. With the better balance, exposure light that transmitted through the phase shift film interferes with the 0-order light to exhibit a higher reduction effect, on a light intensity and improves a pattern resolution property on the resist film. Therefore, a transmittance of the phase shift film 2 to ArF exposure light is preferably 10% or more. A transmittance to ArF exposure light of 15% or more causes further enhancement in the effect of emphasizing the pattern edge of a transfer image (projection optical image) by phase shifting effect. On the other hand, when a transmittance of the phase shift film 2 to the ArF exposure light exceeds 30%, it will be necessary for the SiN-based material for forming the phase shift film 2 to include a certain amount or more oxygen which causes reduction in the EB defect repair rate, which is not preferable.

To obtain a proper phase shifting effect, it is necessary for the phase shift film 2 to have a function to generate a predetermined phase difference between the transmitting ArF exposure light and the light transmitted through the air for the same distance as the thickness of the phase shift film 2. The phase difference is preferably adjusted within the range of 150 degrees or more and 200 degrees or less. The lower limit of the phase difference in the phase shift film 2 is preferably 160 degrees or more, and more preferably 170 degrees or more. On the other hand, the upper limit of the phase difference in the phase shift film 2 is preferably 190 degrees or less. This is for reducing the effect of increase in phase difference caused by minute etching in the transparent substrate 1 upon dry etching for forming a pattern in the phase shift film 2. Another reason is that in recent years, there has been an increasing application of irradiation method of an ArF exposure light on a phase shift mask using an exposure apparatus where ArF exposure light is entered from a direction inclined at a predetermined angle relative to a vertical direction of a film surface of the phase shift film 2.

The phase shift film 2 is made of a material containing silicon and nitrogen. The phase shift film 2 is preferably made of a material consisting of silicon and nitrogen, or a material containing a material consisting of silicon and nitrogen and one or more elements selected from a metalloid element and a non-metallic element. The phase shift film 2 can contain any metalloid elements in addition to silicon. Among these metalloid elements, it is preferable to include one or more elements selected from boron, germanium, antimony, and tellurium, since enhancement in conductivity of silicon to be used as a sputtering target can be expected.

The phase shift film 2 can include any non-metallic elements in addition to nitrogen. The non-metallic elements in this invention refer to those including non-metallic elements in a narrow sense (nitrogen, carbon, oxygen, phosphorus, sulfur, selenium), halogen, and noble gas. Among the non-metallic elements, it is preferable to include one or more elements selected from carbon, fluorine, and hydrogen. In the phase shift film 2, it is preferable that an oxygen content is reduced to 10 atom % or less, more preferably 5 atom % or less, and further preferable not to positively include oxygen, excluding a surface layer region 23 to be mentioned below (lower detection limit or less when composition analysis was conducted by X-ray photoelectron spectroscopy, etc.). When the phase shift film 2 contains a large amount of oxygen, the repair rate of an EB defect repair will become significantly slow.

The phase shift film 2 can contain noble gas. Noble gas is an element which, when present in a film forming chamber in forming the phase shift film 2 by reactive sputtering, can increase the deposition rate to enhance productivity. The noble gas is plasmarized and collided on the target so that target constituent elements eject out from the target, and while incorporating reactive gas on the way, the phase shift film 2 is formed on the transparent substrate 1. While the target-constituent elements eject out from the target until adhered on the transparent substrate 1, a small amount of noble gas in the film forming chamber is incorporated. Preferable noble gas required for the reactive sputtering includes argon, krypton, and xenon. Further, to mitigate stress of the phase shift film 2, neon and helium having a small atomic weight can be positively incorporated into the thin film.

The thickness of the phase shift film 2 is preferably 90 nm or less. When the thickness of the phase shift film 2 is greater than 90 nm, the time necessary for the removal in the EB defect repair will increase. More preferably, the phase shift film 2 has a thickness of 80 nm or less. On the other hand, the phase shift film 2 has a thickness of preferably 40 nm or more. When the thickness of the phase shift film 2 is less than 40 nm, a predetermined transmittance and phase difference required as a phase shift film may not be obtained.

The phase shift film 2 has an overall average value (overall average value of a substrate vicinity region 21, an inner region 22, and a surface layer region 23 to be mentioned below) of a refractive index n (hereafter simply referred to as refractive index n) to an ArF exposure light of preferably 2.0 or more, and more preferably 2.2 or more. Further, the phase shift film 2 has an extinction coefficient k (hereafter simply referred to as extinction coefficient k) to an ArF exposure light in the overall average value of preferably 1.2 or less, and more preferably 1.0 or less. On the other hand, the phase shift film 2 has a refractive index n in the overall average value of preferably 3.0 or less, and more preferably 2.8 or less. Moreover, the phase shift film 2 has an extinction coefficient k in the overall average value of preferably 0.1 or more, and more preferably 0.2 or more. This is because it is difficult to satisfy a predetermined phase difference and a predetermined transmittance to ArF exposure light which are optical characteristics required as the phase shift film 2, unless the ranges of a refractive index n and an extinction coefficient k are within the above range.

A refractive index n and an extinction coefficient k of a thin film are not determined only by the composition of the thin film. Film density and crystal condition of the thin film are also the factors that affect a refractive index n and an extinction coefficient k. Therefore, various conditions in forming the thin film by reactive sputtering are adjusted so that the thin film achieves desired refractive index n and extinction coefficient k. For allowing the phase shift film 2 to have a refractive index n and an extinction coefficient k of the above range, not only the ratio of mixed gas of noble gas and reactive gas is adjusted in forming a thin film by reactive sputtering, but various other adjustments are made upon forming a thin film by reactive sputtering, such as pressure in a film forming chamber, power applied to the target, and positional relationship such as distance between the target and the transparent substrate. Further, these film forming conditions are unique to film forming apparatuses which are adjusted arbitrarily so that the thin film to be formed reaches desired refractive index n and extinction coefficient k.

An interior of the phase shift film 2 is divided into three regions: a substrate vicinity region (vicinity region) 21, an inner region 22, and a surface layer region 23, in this order from the transparent substrate 1 side. The substrate vicinity region 21 is a region ranging from an interface of the phase shift film 2 and the transparent substrate 1 up to a depth of 10 nm toward a surface side (i.e., surface layer region 23 side) opposite from the transparent substrate 1. When the substrate vicinity region 21 is subjected to an X-ray photoelectron spectroscopy, it is likely to be affected by the transparent substrate 1 positioned below. Further, a maximum peak of photoelectron intensity of Si2p narrow spectrum of the substrate vicinity region 21 that is acquired has low precision.

The surface layer region 23 is a region ranging from a surface opposite from the transparent substrate 1 up to a depth of 10 nm toward the transparent substrate 1. Since the surface layer region 23 is a region containing oxygen incorporated from the surface of the phase shift film 2, the surface layer region 23 has a structure with a composition gradient of an oxygen content in a film thickness direction (a structure having a composition gradient where an oxygen content in the film increases with increasing distance from the transparent substrate 1). Namely, the surface layer region 23 has more oxygen content than the inner region 22. Therefore, there is a relatively large difference between the value of maximum peak PSi_fs of photoelectron intensity of Si2p narrow spectrum acquired by subjecting the surface layer region 23 to an X-ray photoelectron spectroscopy and the value of maximum peak PSi_fi of photoelectron intensity of Si2p narrow spectrum acquired by subjecting the inner region 22 to an X-ray photoelectron spectroscopy.

The inner region 22 is a region of the phase shift film 2 excluding the substrate vicinity region 21 and the surface layer region 23. The maximum peak PSi_fi of photoelectron intensity of Si2p narrow spectrum acquired by subjecting the inner region 22 to an X-ray photoelectron spectroscopy is a value having little influence of the transparent substrate 1 and influence of surface layer oxidization. Therefore, the maximum peak PSi_fi of photoelectron intensity of the Si2p narrow spectrum of the inner region 22 can be regarded as a value reflecting the easiness of excitation (work function) of the SiN-based material forming the inner region 22 to an X-ray and electron beam irradiation.

It is required for the inner region 22 of the phase shift film 2 to be made of a material which, in setting a plurality of measurement locations in the inner region 22 in the thickness direction, subjecting each measurement location of the inner region 22 to an X-ray photoelectron spectroscopy, acquiring each maximum peak PSi_fi of photoelectron intensity of Si2p narrow spectrum, calculating an average value PSi_fi_av of the maximum peaks PSi_fi in the plurality of measurement locations, setting a plurality of measurement locations in the transparent substrate 1 in the thickness direction, subjecting each measurement location of the transparent substrate 1 to an X-ray photoelectron spectroscopy, acquiring each maximum peak PSi_sb of photoelectron intensity of Si2p narrow spectrum, calculating an average value PSi_sb_av of the maximum peaks PSi_sb of the plurality of measurement locations, and the average value PSi_fi_av of the maximum peaks PSi_fi of photoelectron intensity of Si2p narrow spectrum in the inner region 22 divided by the average value PSi_sb_av of the maximum peaks PSi_sb of photoelectron intensity of Si2p narrow spectrum in the transparent substrate 1 (PSi_fi_av)/(PSi_sb_av) is 1.08 or more. When (PSi_fi_av)/(PSi_sb_av) is 1.08 or more, the SiN-based material constructing the inner region 22 occupying the majority of the phase shift film 2 is likely to excite when irradiated with an electron beam. Such a phase shift film 2 has a fast repair rate upon an EB defect repair, where digging in the transparent substrate 1 can be prevented. (PSi_fi_av)/(PSi_sb_av) is preferably 1.085 or more, and more preferably 1.09 or more.

It is preferable that the surface layer region 23 of the phase shift film 2 is made of a material which, in setting a plurality of measurement locations in the surface layer region 23 in the thickness direction, subjecting each measurement location of the surface layer region 23 to an X-ray photoelectron spectroscopy, acquiring each maximum peak FSi_fs of photoelectron intensity of Si2p narrow spectrum, calculating an average value PSi_fs_av of the maximum peaks PSi_fs in the plurality of measurement locations, and the average value PSi_fs_av of the maximum peaks PSi_fs of photoelectron intensity of Si2p narrow spectrum in the surface layer region 23 divided by the average value PSi_sb_av of the maximum peaks PSi_sb of photoelectron intensity of Si2p narrow spectrum in the transparent substrate 1 (PSi_fs_av)/(PSi_sb_av) is 1.05 or more. When (PSi_fs_av)/(PSi_sb_av) is 1.05 or more, the surface layer region 23, which contains the largest amount of oxygen in the phase shift film 2, is also likely to excite when subjected to an electron beam irradiation. Since the surface layer region 23 has more oxygen content compared to the inner region 22, it is inevitable that the repair rate when the surface layer region 23 is subjected to an EB defect repair becomes slower than the inner region 22. However, reduction width of the repair rate caused by including oxygen can be reduced. (PSi_fs_av)/(PSi_sb_av) is more preferably 1.06 or more, and even more preferably 1.07 or more.

The inner region 22 of the phase shift film 2 has a nitrogen content of preferably 50 atom % or more, and more preferably 52 atom % or more. A thin film of an SiN-based material with less nitrogen content has a small refractive index n to an ArF exposure light, and with increasing nitrogen content, a refractive index n to an ArF exposure light of the thin film tends to increase. Particularly, in the case of forming the phase shift film 2 with 10% or more transmittance to ArF exposure light from an SiN-based material, including 50 atom % or more nitrogen can secure predetermined transmittance and phase difference with lesser film thickness. On the other hand, the inner region 22 preferably has a nitrogen content of 57 atom % or less which corresponds to a mixing rate of $Si_3N_4$. When the thin film of an SiN-based material (in this case, inner region 22) is rendered to include more nitrogen than the mixing ratio of $Si_3N_4$, it would be difficult to form the thin film into an amorphous structure and a microcrystalline structure. Further, surface roughness of the thin film will significantly deteriorate.

The inner region 22 of the phase shift film 2 is preferably made of a material consisting of silicon and nitrogen. Incidentally, noble gas is an element that is difficult to detect even if the inner region 22 is subjected to composition analysis such as X-ray photoelectron spectroscopy and Rutherford Back-Scattering Spectrometry (RBS). Therefore, the material consisting of silicon and nitrogen can be regarded as including a material containing noble gas.

It is most preferable for the phase shift film 2 to have an amorphous structure. This is due to good pattern edge roughness to be achieved when a pattern is formed by etching, for example. In the case of a composition involving difficulty in forming the phase shift film 2 into an amorphous structure, a mixed condition of an amorphous structure and a microcrystalline structure is preferable.

The surface layer region 23 of the phase shift film 2 is preferably formed of a material which, in setting a plurality of measurement locations in the surface layer region 23 in the thickness direction, subjecting each measurement location of the surface layer region 23 to an X-ray photoelectron spectroscopy, acquiring each maximum peak PN_fs of photoelectron intensity of N1s narrow spectrum, calculating an average value PN_fs_av of maximum peaks PN_fs in the plurality of measurement locations, setting a plurality of measurement locations in the inner region 22 in the thickness direction, subjecting each measurement location of the inner region 22 to an X-ray photoelectron spectroscopy, acquiring each maximum peak PN_fi of photoelectron intensity of N1s narrow spectrum, and calculating an average value PN_fi_av of maximum peaks PN_fi in the plurality of measurement locations, the value (PN_fs_av)/(PN_fi_av) obtained by the average value PN_fs_av of maximum peaks of photoelectron intensity of N1s narrow spectrum in the surface layer region 23 divided by the average value PN_fi_av of the maximum peaks PN_fi of photoelectron intensity of N1s narrow spectrum in the inner region 22 is 0.98 or less.

A maximum peak of photoelectron intensity of N1s narrow spectrum is a reference of a nitrogen content of the object to be measured. (PN_fs_av)/fPN_fi_av) is a reference to see the ratio of Si—N bond number of the surface layer region 23 to Si—N bond number of the inner region 22. As (PN_fs_av)/(PN_fi_av) decreases, it can be regarded that an abundance ratio of Si—N bond of the surface layer region 23 is low and an abundance ratio of Si—O bond is high. When the abundance ratio of Si—N bond of the surface layer region 23 is too high (i.e., abundance ratio of Si—O bond is too low), chemical resistance of the phase shift film will decrease. (PN_fs_av)/(PN_fi_av) is more preferably 0.97 or less, and further preferably 0.96 or less. On the other hand, (PN_fs_av)/(PN_fi_av) is preferably 0.94 or more. When (PN_fs_av)/(PN_fi_av) is less than 0.94, there will be a large abundance ratio of Si—O bond of the surface layer region 23, causing significant decrease of the repair rate when the surface layer region 23 is subjected to an EB defect repair.

In the X-ray photoelectron spectroscopy above, while any of AlKα ray and MgKα ray is applicable as the X-ray to be irradiated on the transparent substrate 1 and the phase shift film 2, AlKα ray is preferably used. Incidentally, described herein is the case of conducting an X-ray photoelectron spectroscopy using an X-ray of AlKα ray.

A method of obtaining Si2p narrow spectrum and N1s narrow spectrum through an X-ray photoelectron spectroscopy on the transparent substrate 1 or the phase shift film 2 is generally carried out by the following procedures. Namely, initially, a wide-scanning is carried out to acquire photoelectron intensity (number of discharge of photoelectrons per unit time from X ray-irradiated measurement object) at a bandwidth of a wide range of binding energy to acquire a wide spectrum, and all peaks derived from the constituent elements of the transparent substrate 1 and the phase shift film 2 are specified. Subsequently, each narrow spectrum is acquired by performing a narrow scanning, which has higher resolution than the wide scan but bandwidth of binding energy that can be obtained is narrow, with a bandwidth around the peaks of interest (Si2p, N1s, etc.). On the other hand, the constituent elements of the transparent substrate 1 and the phase shift film 2, which are the measurement objects to be subjected to an X-ray photoelectron spectroscopy in this invention, were known previously. Further, the narrow spectrum required in this invention is limited to Si2p narrow spectrum and N1s narrow spectrum. Therefore, in the case of this invention, the step of obtaining a wide spectrum can be omitted and Si2p narrow spectrum and N1s narrow spectrum can be obtained.

The maximum peak (PSi_fs, PSi_fi, PSi_sb) of photoelectron intensity of Si2p narrow spectrum acquired by subjecting the transparent substrate 1 or the phase shift film 2 to an X-ray photoelectron spectroscopy is preferably a maximum peak within the range of 96 [eV] or more and 106 [eV] or less binding energy. This is because a peak beyond the range of the binding energy may not be photoelectrons emitted from Si—N bond and Si—O bond. Further, the maximum peak (PN_fs, PN_fi) of photoelectron intensity of N1s narrow spectrum acquired by subjecting the phase shift film 2 to an X-ray photoelectron spectroscopy is preferably a maximum peak within the range of 392 [eV] or more and 402 [eV] or less binding energy. This is because a peak beyond the range of the binding energy may not be photoelectrons emitted from Si—N bond.

While the phase shift film 2 is formed by sputtering, any sputtering method is applicable such as DC sputtering, RF sputtering, and ion beam sputtering. In the case of using a target with low conductivity (silicon target, silicon compound target free of or including little amount of metalloid element, etc.), application of RF sputtering and ion beam sputtering is preferable. However, application of RF sputtering is more preferable, considering the deposition rate. A method for manufacturing the mask blank 100 preferably includes at least the step of forming the phase shift film 2 on the transparent substrate 1 by reactive sputtering using a silicon target or a target made of a material containing silicon and one or more elements selected from a metalloid element and a non-metallic element in sputtering gas containing nitrogen-based gas and noble gas.

In the method of manufacturing the mask blank 100, sputtering gas used in the phase shift film 2 forming step is preferably selected to have a mixing ratio of nitrogen gas that is more than the range of mixing ratio of nitrogen gas of a transition mode in which film formation tends to be unstable (selecting nitrogen gas mixing ratio to render so-called poison mode (reaction mode) is preferable). Nitrogen-based gas used in the phase shift film 2 forming step can be any gas as long as the gas contains nitrogen. As mentioned above, since it is preferable that the phase shift film 2 has less oxygen content, it is preferable to apply nitrogen-based gas free of oxygen, and it is more preferable to apply nitrogen gas ($N_2$ gas). Any noble gas is applicable as noble gas to be used in the phase shift film 2 forming step. Preferable noble gas herein includes argon, krypton, and xenon. Further, to mitigate stress of the thin film, neon and helium having a small atomic weight can be positively incorporated into the thin film.

Further, the method of manufacturing the mask blank 100 preferably has the step of oxidizing at least a part of the surface layer region 23 of the phase shift film 2 after the step of forming the phase shift film 2. The treatment of oxidizing the surface layer region 23 in this case includes heat treatment in gas containing oxygen such as in the atmosphere, photoirradiation treatment such as a flash lamp in gas containing oxygen such as in the atmosphere, treatment of contacting ozone or oxygen plasma on the surface of the phase shift film 2, etc.

Figure 2A:
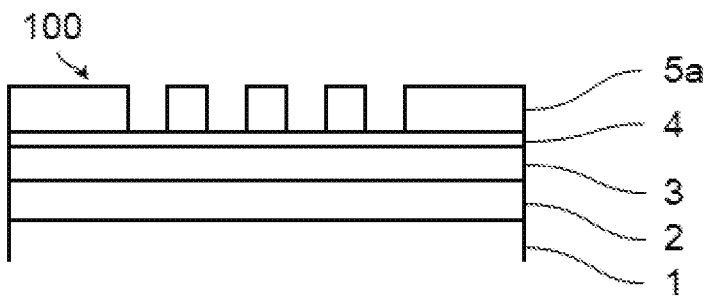
FIGS. 2(a)-2(f) are cross-sectional views showing the manufacturing steps of a transfer mask of an embodiment of this invention.
Figure 2B:
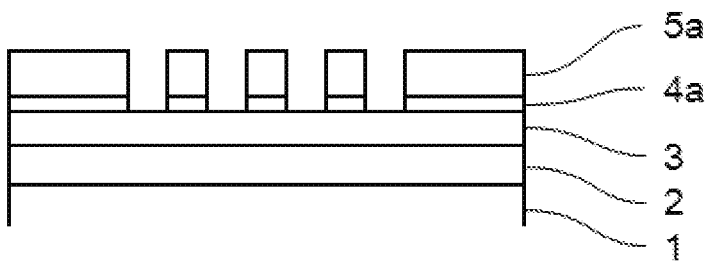

The mask blank 100 preferably has a light shielding film 3 on the phase shift film 2. Generally, in the phase shift mask 200 (see FIG. 2(f)), an outer peripheral region of a region where a transfer pattern is formed (transfer pattern forming region) is desired to ensure an optical density (OD) of a predetermined value or more to prevent the resist film from being subjected to an influence of an exposure light that transmitted through the outer peripheral region when an exposure transfer was made on the resist film on a semiconductor wafer using an exposure apparatus. The outer peripheral region of the phase shift mask 200 is at least required have an optical density of more than 2.0. The phase shift film 2 has a function to transmit an exposure light at a predetermined transmittance as mentioned above, and it is difficult to ensure the above optical density with the phase shift film 2 alone. Therefore, it is preferable to stack the light shielding film 3 on the phase shift film 2 at the stage of manufacturing the mask blank 100 to ensure optical density that is lacking. With such a structure of the mask blank 100, the phase shift mask 200 ensuring the above optical density on the outer peripheral region can be manufactured by removing the light shielding film 3 of the region using the phase shifting effect (basically, transfer pattern forming region) during manufacture of the phase shift film 2. Incidentally, in the mask blank 100, the optical density of the stacked structure of the phase shift film 2 and the light shielding film 3 is preferably 2.5 or more, and more preferably 2.8 or more. Further, for reducing the film thickness of the light shielding film 3, the stacked structure of the phase shift film 2 and the light shielding film 3 has an optical density of preferably 4.0 or less.

A single layer structure and a stacked structure of two or more layers are applicable to the light shielding film 3. Further, each layer in the light shielding film 3 of a single layer structure and the light shielding film 3 with a stacked structure of two or more layers can be configured by approximately the same composition in the thickness direction of the layer or the film, or with a composition gradient in the thickness direction of the layer.

In the case where the light shielding film 3 is stacked on the phase shift film 2 without an intervening film, it is necessary to apply a material having sufficient etching selectivity to an etching gas used in forming a pattern in the phase shift film 2. The light shielding film 3 in this case is preferably made of a material containing chromium. Materials containing chromium for forming the light shielding film 3 can include, in addition to chromium metal, a material containing chromium and one or more elements selected from oxygen, nitrogen, carbon, boron, and fluorine.

While a chromium-based material is generally etched by mixed gas of chlorine-based gas and oxygen gas, etching rate of the chromium metal to the etching gas is not as high. Considering enhancing an etching rate of the mixed gas of chlorine-based gas and oxygen gas to etching gas, the material forming the light shielding film 3 preferably includes chromium and one or more elements selected from oxygen, nitrogen, carbon, boron, and fluorine. Further, one or more elements among molybdenum and tin can be included in the material containing chromium for forming the light shielding film 3. Including one or more elements among molybdenum and tin can increase an etching rate to the mixed gas of chlorine-based gas and oxygen gas.

On the other hand, in the case of a structure where another film is interposed between the light shielding film 3 and the phase shift film 2 in the mask blank 100, it is preferable to form the another film (etching stopper and etching mask film) from the material containing chromium, and forming the light shielding film 3 from a material containing silicon. While the material containing chromium is etched by mixed gas of chlorine-based gas and oxygen gas, a resist film made of an organic material is likely to be etched by this mixed gas. A material containing silicon is generally etched by fluorine-based gas or chlorine-based gas. Since these etching gases are basically free of oxygen, film reduction amount of a resist film made of an organic material can be reduced more than etching with mixed gas of chlorine-based gas and oxygen gas. Therefore, film thickness of the resist film can be reduced.

A material containing silicon for forming the light shielding film 3 can include a transition metal, and can include metal elements other than the transition metal. The reason is that in the case where the phase shift mask 200 was manufactured from this mask blank 100, the pattern formed by the light shielding film 3 is basically a light shielding band pattern of an outer peripheral region having less accumulation of irradiation with ArF exposure light compared to a transfer pattern formation region, and the light shielding film 3 rarely remains in a fine pattern so that substantial problems hardly occur even if ArF light fastness is low. Another reason is that when a transition metal is included in the light shielding film 3, light shielding performance is significantly improved compared to the case without the transition metal, and the thickness of the light shielding film can be reduced. The transition metals to be included in the light shielding film 3 include any one of metals such as molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), and palladium (Pd), or a metal alloy thereof.

On the other hand, a material consisting of silicon and nitrogen, or a material consisting of silicon and nitrogen with a material containing one or more elements selected from a metalloid element and a non-metallic element is applicable as a material containing silicon for forming the light shielding film 3.

In the mask blank 100 having the light shielding film 3 stacked on the phase shift film 2, a preferable structure is that a hard mask film 4 made of a material having etching selectivity to etching gas used in etching the light shielding film 3 is further stacked on the light, shielding film 3. Since the light shielding film 3 must have a function to secure a predetermined optical density, there is a limitation to reduce its thickness. The hard mask film 4 is only required to have a film thickness sufficient to function as an etching mask until the completion of dry etching for forming a pattern in the light shielding film 3 immediately below the hard mask film 4, and basically is not optically limited. Therefore, the thickness of the hard mask film 4 can be reduced significantly compared to the thickness of the light shielding film 3. Since the resist film of an organic material is only required to have a film thickness sufficient to function as an etching mask until completion of dry etching for forming a pattern in the hard mask film 4, the thickness of the resist film can be reduced more significantly than previous cases.

In the case where the light shielding film 3 is made of a material containing chromium, the hard mask film 4 is preferably made of the material containing silicon given above. Since the hard mask film 4 in this case tends to have low adhesiveness with the resist film of an organic material, it is preferable to treat the surface of the hard mask film 4 with HMDS (Hexamethyldisilazane) to enhance surface adhesiveness. The hard mask film 4 in this case is more preferably made of $SiO_2$, SiN, SiON, etc. Further, in the case where the light shielding film 3 is made of a material containing chromium, materials containing tantalum are also applicable as the materials of the hard mask film 4, in addition to the materials given above. The material containing tantalum in this case includes, in addition to tantalum metal, a material containing tantalum and one or more elements selected from nitrogen, oxygen, boron, and carbon, for example, Ta, TaN, TaON, TaBN, TaBON, TaCN, TaCON, TaBCN, and TaBOCN. On the other hand, in the case where the light shielding film 3 is made of a material containing silicon, the hard mask film 4 is preferably made of the material containing chromium given above.

In the mask blank 100, a resist film of an organic material is preferably formed in contact with the surface of the hard mask film 4 at a film thickness of 100 nm or less. In the case of a fine pattern applicable to DRAM hp32 nm generation, a SRAF (Sub-Resolution Assist Feature) with 40 nm line width may be provided on a transfer pattern (phase shift pattern) to be formed in the hard mask film 4. However, even in this case, the cross-sectional aspect ratio of the resist pattern can be reduced down to 1:2.5 so that collapse and peeling off of the resist pattern can be prevented in rinsing and developing, etc. of the resist film. It is more preferable that the resist film has a film thickness of 80 nm or less.

FIGS. 2(*a*)-2(*f*) provide a schematic cross-sectional view showing the steps of manufacturing the phase shift mask 200 from the mask blank 100 of an embodiment of this invention.

The phase shift mask 200 of this invention is featured in a phase shift mask having a phase shift film 2 (phase shift pattern 2*a*) having a transfer pattern on a transparent substrate 1, the phase shift film 2 is made of a material containing silicon and nitrogen, a plurality of measurement locations is set in the thickness direction in an inner region 22 which is a region excluding a vicinity region (substrate vicinity region) 21 of an interface of the phase shift film 2 with the transparent substrate 1 and a surface layer region 23 opposite from the transparent substrate 1, an X-ray photoelectron spectroscopy is conducted to acquire a maximum peak PSi_fi of photoelectron intensity of the Si2p narrow spectrum for each of the plurality of measurement locations of the inner region 22, an average value PSi_fi_av of the acquired maximum peaks PSi_fi is each acquired, a plurality of measurement locations is set in the transparent substrate 1 in the thickness direction, an X-ray photoelectron spectroscopy is conducted to acquire a maximum peak PSi_sb of photoelectron intensity of Si2p narrow spectrum in each of the plurality of measurement locations of the transparent substrate 1, an average value PSi_sb_av of the acquired maximum peaks PSi_sb is each acquired, and the value obtained by the average value PSi_fi_av of the phase shift film 2 divided by the average value PSi_sb_av of the transparent substrate 1 (PSi_fi_av)/(PSi_sb_av) is 1.08 or more.

The phase shift mask 200 has a technical feature that is similar to the mask blank 100. Matters regarding the transparent substrate 1, phase shift film 2, and light shielding film 3 of the phase shift mask 200 are similar to the mask blank 100.

Further, the method of manufacturing the phase shift mask 200 of this invention is featured in utilizing the mask blank 100 described above, including the steps of forming a transfer pattern in the light shielding film 3 by dry etching, forming a transfer pattern in the phase shift film 2 by dry etching with the light shielding film 3 (light shielding pattern 3a) having a transfer pattern as a mask, and forming a pattern (light shielding pattern 3b) including a light shielding band in the light shielding film 3 (light shielding pattern 3a) by dry etching with a resist film (resist pattern 6b) having a pattern including a light shielding band as a mask.

In the case of manufacturing a phase shift mask 200 having a fine pattern applicable to the recent DRAM hp32 nm generation, the case in which there is no black defect portion at all at the stage where a transfer pattern was formed by dry etching in the phase shift film 2 of the mask blank 100 is extremely rare. Further, an EB defect repair is often applied in a defect repair performed on a black defect portion of the phase shift film 2 having the fine pattern described above. The phase shift mask 200 has a fast repair rate to an EB defect repair, even if the phase shift film 2 is made of a material containing silicon and nitrogen, and has a high repair rate ratio to an EB defect repair of the phase shift film 2 to the transparent substrate 1. Therefore, excessive digging of the surface of the transparent substrate 1 can be inhibited when an EB defect repair was conducted on the black defect portion of the phase shift film 2 so that the repaired phase shift mask 200 has high transfer precision.

Further, when the phase shift mask 200 subjected to an EB defect repair to a black defect portion is set on a mask stage of an exposure apparatus using ArF excimer laser as an exposure light and a phase shift pattern 2a is exposure-transferred on a resist film on a semiconductor device, a pattern can be transferred on the resist film on the semiconductor device at a precision that sufficiently satisfies the design specification.

One example of the method of manufacturing the phase shift mask 200 is explained below according to the manufacturing steps shown in FIGS. 2(a)-2(f). In this example, a material containing chromium is used for the light shielding film 3, and a material containing silicon is used for the hard mask film 4.

First, a resist film was formed in contact with the hard mask film 4 of the mask blank 100 by spin coating. Next, a first pattern, which is a transfer pattern (phase shift pattern) to be formed in the phase shift film 2, was exposed and written on the resist film, and predetermined treatments such as developing were further conducted, to thereby form a first resist pattern 5a having a phase shift pattern (see FIG. 2(a)). Subsequently, dry etching was conducted using fluorine-based gas with the first resist pattern 5a as a mask, and a first pattern (hard mask pattern 4a) was formed in the hard mask film 4 (see FIG. 2(b)).

Figure 2C:
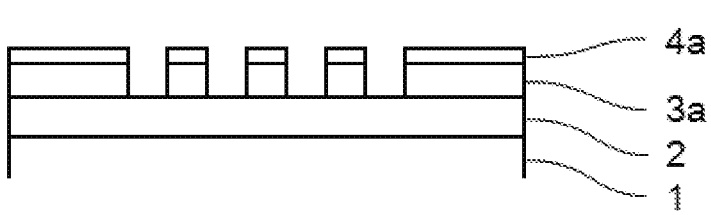

Next, after removing the resist pattern 5a, dry etching was conducted using mixed gas of chlorine-based gas and oxygen gas with the hard mask pattern 4a as a mask, and a first pattern (light shielding pattern 3a) was formed in the light shielding film 3 (see FIG. 2(c)). Subsequently, dry etching was conducted using fluorine-based gas with the light shielding pattern 3a as a mask, and a first pattern (phase shift pattern 2a) was formed in the phase shift film 2, and at the same time the hard mask pattern 4a was removed (see FIG. 2(d)).

Next, a resist film was formed on the mask blank 100 by spin coating. Next, a second pattern, which is a pattern (light shielding pattern) to be formed in the light shielding film 3, was exposed and written in the resist film, and predetermined treatments such as developing were conducted, to thereby form a second resist pattern 6b having a light shielding pattern. Subsequently, dry etching was conducted using mixed gas of chlorine-based gas and oxygen gas with the second resist pattern 6b as a mask, and a second pattern (light shielding pattern 3b) was formed in the light shielding film 3 (see FIG. 2(e)). Further, the second resist pattern 6b was removed, predetermined treatments such as cleaning were conducted, and the phase shift mask 200 was obtained (see FIG. 2(f)).

There is no particular limitation on chlorine-based gas to be used for the dry etching described above, as long as Cl is included. The chlorine-based gas includes, for example, $Cl_2$, $SiCl_2$, $CHCl_3$, $CH_2Cl_2$, $CCl_4$, and $BCl_3$. Further, there is no particular limitation on fluorine-based gas used for the dry etching described above, as long as F is included. The fluorine-based gas includes, for example, $CHF_3$, $CF_4$, $C_2F_6$, $C_4F_8$, and $SF_6$. Particularly, fluorine-based gas free of C can further reduce damage on the transparent substrate 1 for having a relatively low etching rate to the transparent substrate 1 of a glass material.

Moreover, the method of manufacturing the semiconductor device of this invention is featured in using the phase shift mask 200 manufactured using the mask blank 100 described above, and exposure-transferring a pattern in a resist film on a semiconductor substrate. The mask blank 100 and the phase shift mask 200 manufactured using the mask blank 100 of this invention exhibit the above effect. Therefore, a pattern can be transferred on a resist film on a semiconductor device at a precision that sufficiently satisfies the design specification, when the phase shift mask 200 subjected to an EB defect repair on a black defect portion is set on a mask stage of an exposure apparatus using ArF excimer laser as an exposure light and a phase shift pattern 2a is exposure-transferred on a resist film on a semiconductor device. Therefore, in the case where a lower layer film was dry etched to form a circuit pattern using a pattern of this resist film as a mask, a highly precise circuit pattern without short-circuit of wiring and disconnection caused by insufficient precision can be formed.

EXAMPLES

The embodiments for carrying out this invention will be further explained concretely below by Examples.

Example 1

Manufacture of Mask Blank

A transparent substrate 1 made of a synthetic quartz glass with a size of a main surface of about 152 mm×about 152 mm and a thickness of about 6.25 mm was prepared. An end surface and the main surface of the transparent substrate 1 were polished to a predetermined surface roughness, and thereafter subjected to predetermined cleaning treatment and drying treatment.

Next, a phase shift film 2 consisting of silicon and nitrogen was formed on the transparent substrate 1 at a thickness of 62 nm. The phase shift film 2 was formed by placing the transparent substrate 1 in a single-wafer RF sputtering apparatus, and by reactive sputtering (RF sputtering) using a silicon (Si) target, using mixed gas of krypton (Kr), helium (He), and nitrogen ($N_2$) as sputtering gas, and with RF power source.

Next, the transparent substrate 1 having the phase shift film 2 formed thereon was subjected to heat treatment under the condition of 280° C. heating temperature in the atmosphere for the processing time of 30 minutes. Transmittance and phase difference of the phase shift film 2 after the heat treatment to wavelength of an ArF excimer laser light (about 193 nm) were measured using a phase shift measurement device (MPM-193 manufactured by Lasertec), and the transmittance was 17.1% and the phase difference was 176.1 degrees. Further, a phase shift film was formed on a main surface of another transparent substrate under the same conditions, further subjected to heat treatment under the same conditions, optical characteristics of the phase shift film were measured using a spectroscopic ellipsometer (M-2000D manufactured by J. A. Woollam), and the refractive index n was 2.58 and the extinction coefficient k was 0.39 at a wavelength of 193 nm.

Another phase shift film was formed on a main surface of another transparent substrate under the same film forming conditions as the phase shift film 2 of Example 1, and further subjected to heat treatment under the same conditions. Next, the another transparent substrate and the phase shift film after the heat treatment were subjected to an X-ray photoelectron spectroscopy. In this X-ray photoelectron spectroscopy, an X-ray (AlKα ray: 1436 eV) was irradiated on a surface of the phase shift film (and transparent substrate), an intensity of photoelectrons discharged from the phase shift film was measured, a surface of the phase shift film (and transparent substrate) was dug for a predetermined time (about 0.7 nm depth) by Ar gas sputtering, the phase shift film (and transparent substrate) of the dug region was irradiated with an X-ray to measure an intensity of photoelectrons discharged from the region of the phase shift, film that has been dug, and by repeating the above steps, Si2p narrow spectrum and N1s narrow spectrum were acquired for each of the phase shift film and the transparent substrate. This X-ray photoelectron spectroscopy was conducted under the conditions of using AlKα ray (1486.6 eV) as an X-ray, and the detection region of photoelectrons as 200 μmφ, and take-off angle of 45 deg (the same applies to Comparative Example hereafter).

In this X-ray photoelectron spectroscopy, measurement locations were provided in the phase shift film and the transparent substrate for every 0.7 nm from the surface. A region from the surface of the phase shift film up to the measurement location at the depth of 9.8 nm inclusive (i.e., region from a surface of the phase shift film up to a depth of 10 nm) is regarded as the surface layer region of the phase shift film; and a region from the surface of the phase shift film to a measurement location at the depth of 51.8 nm inclusive from the measurement location of the depth of 10.5 nm (i.e., region from a surface of the phase shift film up to a depth of from above 10 nm up to 52 nm) is regarded as the inner region of the phase shift film.

Figure 3:
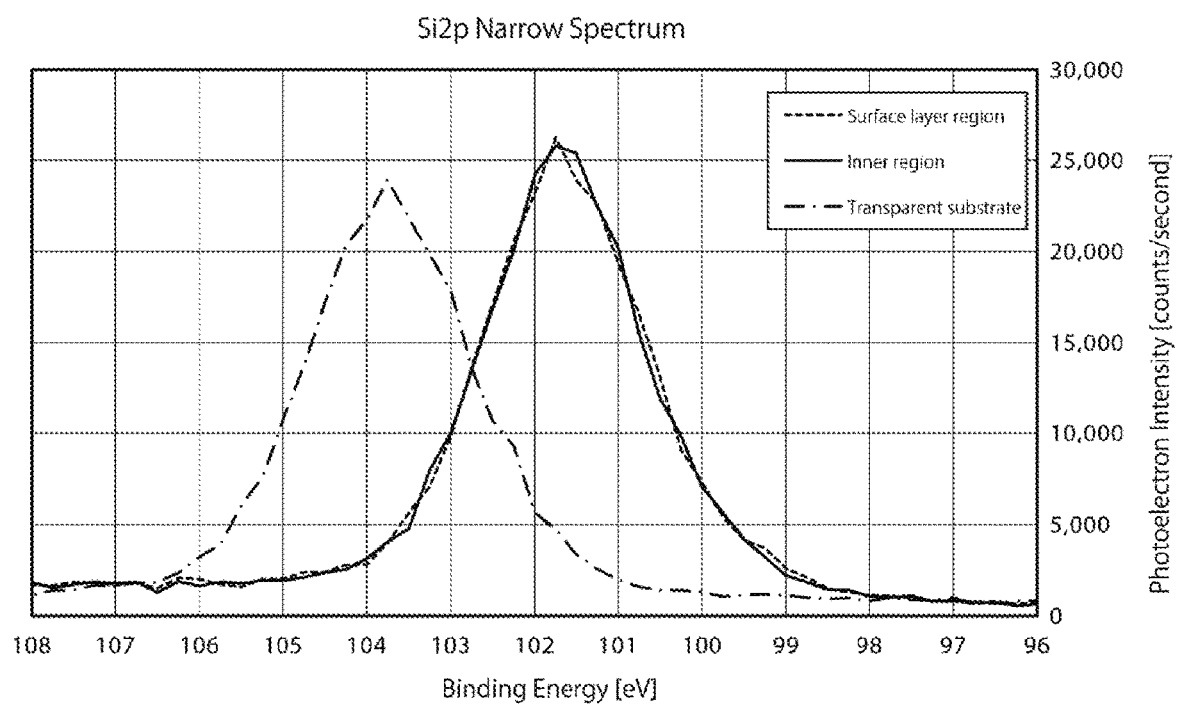
FIG. 3 shows a result of an X-ray photoelectron spectroscopy on a phase shift film and a transparent substrate of a mask blank according to Example 1 (Si2p narrow spectrum).

FIG. 3 shows each Si2p narrow spectrum of the surface layer region of the phase shift film (measurement location at a depth of 8.4 nm from the phase shift film surface), the inner region (measurement location at a depth of 29.4 nm from the phase shift film surface), and the transparent substrate (measurement location at a depth of 33.6 nm from the transparent substrate surface). Each Si2p narrow spectrum in FIG. 3 shows measurement locations having the greatest maximum peaks (PSi_fs, PSi_fi, PSi_sb) in all measurement locations measured in each of the surface layer region, the inner region, and the transparent substrate.

Figure 4:
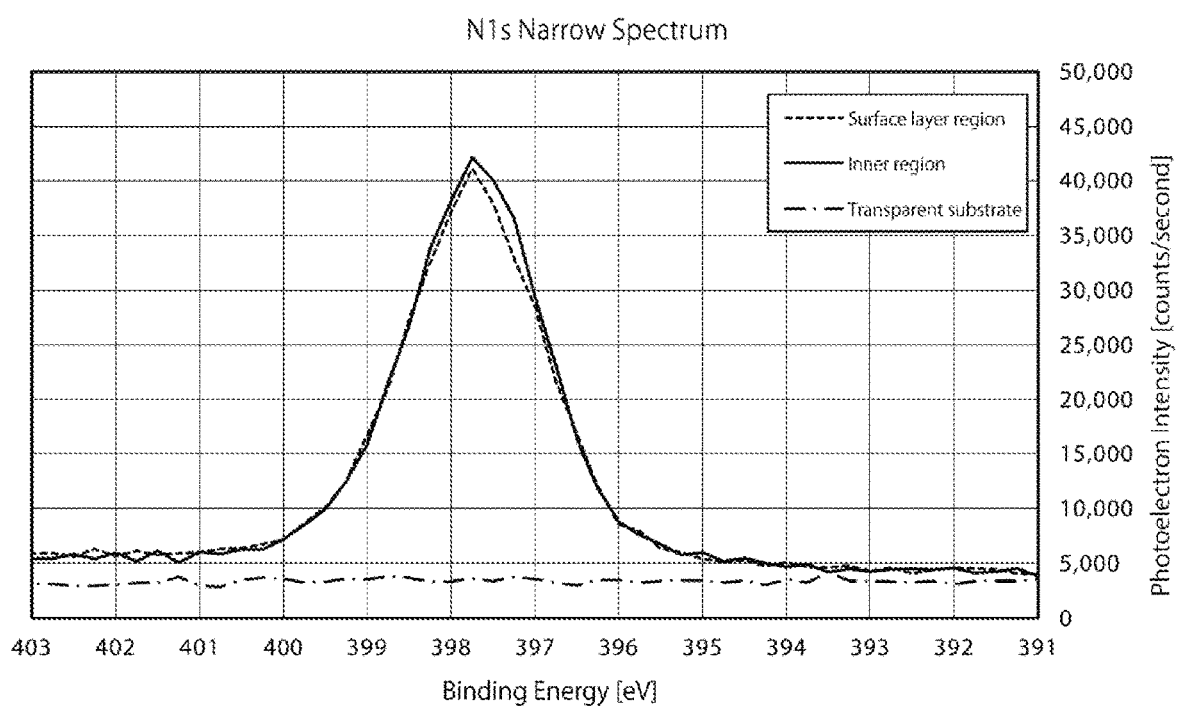
FIG. 4 shows a result of an X-ray photoelectron spectroscopy on a phase shift film and a transparent substrate of a mask blank according to Example 1 (N1s narrow spectrum).

FIG. 4 shows each N1s narrow spectrum of the surface layer region of the phase shift film (measurement location at a depth of 8.4 nm from the phase shift film surface), the inner region (measurement location at a depth of 29.4 nm from the phase shift film surface), and the transparent substrate (measurement location at a depth of 33.6 nm from the transparent substrate surface) . Each N1s narrow spectrum in FIG. 4 shows measurement locations having the greatest maximum peaks (PN_fs, PN_fi, PN_sb) in all measurement locations measured in each of the surface layer region, the inner region, and the transparent substrate.

Based on the result of the X-ray photoelectron spectroscopy, an average value PSi_fi_av of maximum peaks PSi_fi of Si2p narrow spectrum of the inner region of the phase shift film divided by an average value PSi_sb_av of maximum peaks PSi_sb of Si2p narrow spectrum of the transparent substrate (PSi_fi_av)/(PSi_sb_av) was calculated, and the value was 1.092. Incidentally, the average value of the maximum peaks of the transparent substrate was calculated using a maximum peak PSi_sb of each measurement location between a depth of 10.5 nm from the surface of the transparent substrate up to a depth of 30.8 nm (same hereinafter).

An average value PSi_fs_av of maximum peaks PSi_fs of Si2p narrow spectrum of the surface layer region of the phase shift film divided by an average value PSi_sb_av of maximum peaks PSi_sb of Si2p narrow spectrum of the transparent substrate (PSi_fs_av)/(PSi_sb_av) was calculated, and the value was 1.076. An average value PN_fs_av of maximum peaks PN_fs of N1s narrow spectrum of the surface layer region of the phase shift film divided by an average value PN_fi_av of maximum peaks PN_fi of N1s narrow spectrum of the inner region of the phase shift film (PN_fs_av)/(PN_fi_av) was calculated, and the value was 0.957. Further, from the result of this X-ray photoelectron spectroscopy, it was found that the average composition of the inner region of the phase shift film is Si:N=45:55 (atom % ratio).

Next, a lowermost layer of the light shielding film 3 consisting of CrOCN was formed in contact with a surface of the phase shift film 2 at a thickness of 30 nm. The lowermost layer was formed by placing the transparent substrate 1 having the phase shift film 2 formed after heat treatment, in a single-wafer DC sputtering apparatus, and by reactive sputtering (DC sputtering) using a chromium (Cr) target, with mixed gas of argon (Ar), carbon dioxide ($CO_2$), nitrogen ($N_2$), and helium (He) (flow ratio Ar:$CO_2$:$N_2$He=22:39:6:33, pressure=0.2 Pa) as sputtering gas, and with 1.9 kW electric power of DC power source.

Next, a lower layer of the light shielding film 3 consisting of CrN was formed on the lowermost layer of the light shielding film 3 at a thickness of 4 nm. The lower layer was formed by reactive sputtering (DC sputtering) using the same chromium (Cr) target, with mixed gas of argon (Ar) and nitrogen ($N_2$) (flow ratio Ar:$N_2$=83:17, pressure=0.1 Pa) as sputtering gas, and with 1.4 kW electric power of DC power source.

Next, an upper layer of the light shielding film 3 consisting of CrOCN was formed on the lower layer of the light shielding film 3 at a thickness of 14 nm. The upper layer was formed by reactive sputtering (DC sputtering) using the same chromium (Cr) target, with mixed gas of argon (Ar), carbon dioxide ($CO_2$), nitrogen ($N_2$), and helium (He) (flow ratio Ar:$CO_2$:$N_2$:He=21:37:11:31, pressure=0.2 Pa) as sputtering gas, and with 1.9 kW electric power of DC power source. Through the above procedures, a light shielding film 3 of a chromium-based material made of a three-layer structure of the lowermost layer consisting of CrOCN, the lower layer consisting of CrN, and the upper layer consisting of CrOCN from the phase shift film 2 side was formed with a total film thickness of 48 nm.

Moreover, a hard mask film 4 consisting of silicon and oxygen was formed on the light shielding film 3 at a thickness of 5 nm. The hard mask film 4 was formed by placing the transparent substrate 1 having the phase shift film 2 and the light shielding film 3 stacked thereon in a single-wafer RF sputtering apparatus, and by RF sputtering using a silicon dioxide ($SiO_2$) target with argon (Ar) gas (pressure=0.03 Pa) as sputtering gas, and with 1.5 kW electric power of RF power source. Through the above procedures, a mask blank 100 having a structure where the phase shift film 2, the light shielding film 3, and the hard mask film 4 are stacked on the transparent substrate 1 was manufactured.

Manufacture of Phase Shift Mask

Next, a phase shift mask 200 of Example 1 was manufactured through the following procedure using the mask blank 100 of Example 1. First, a surface of the hard mask film 1 was subjected to HMDS treatment. Subsequently, a resist film of a chemically amplified resist for electron beam writing was formed in contact with a surface of the hard mask film 4 by spin coating at a film thickness of 80 nm. Next, a first pattern, which is a phase shift pattern to be formed in the phase shift film 2, was written by an electron beam on the resist film, predetermined cleaning and developing treatments were conducted, and a first resist pattern 5a having the first pattern was formed (see FIG. 2(a)). At this stage, a program defect was added to the first pattern that has been written by the electron beam in addition to the phase shift pattern that is to be originally formed so as to form a black defect on the phase shift film 2.

Next, dry etching using $CF_4$ gas was conducted with the first resist pattern 5a as a mask, and a first pattern (hard mask pattern 4a) was formed in the hard mask film 4 (see FIG. 2(b)).

Next, the first resist pattern 5a was removed. Subsequently, dry etching was conducted using mixed gas of chlorine and oxygen (gas flow ratio $Cl_2:O_2$=4:1) with the hard mask pattern 4a as a mask, and a first pattern (light shielding pattern 3a) was formed in the light shielding film 3 (see FIG. 2(c)).

Figure 2D:
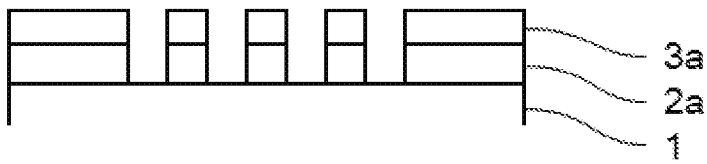
Figure 2E:
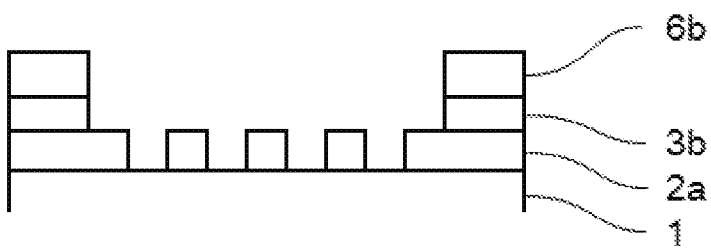
Figure 2F:
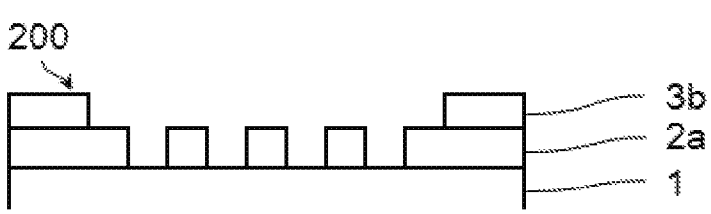

Next, dry etching was conducted using fluorine-based gas (mixed gas of $SF_6$ and He) with the light shielding pattern 3a as a mask, and a first pattern (phase shift pattern 2a) was formed in the phase shift film 2, and at the same time the hard mask pattern 4a was removed (see FIG. 2(d)).

Next, a resist film of a chemically amplified resist for electron beam writing was formed on the light shielding pattern 3a by spin coating at a film thickness of 150 nm. Next, a second pattern, which is a pattern (light shielding pattern) to be formed in the light shielding film 3, was exposed and written on the resist film, further subjected to predetermined treatments such as developing, and a second resist pattern 6b having a light shielding pattern was formed. Subsequently, dry etching was conducted with mixed gas of chlorine and oxygen (gas flow ratio $Cl_2:O_2$=4:1) using the second resist pattern 6b as a mask, and a second pattern (light shielding pattern 3b) was formed in the light shielding film 3 (see FIG. 2(e)). Further, the second resist pattern 6b was removed, predetermined treatments such as cleaning were carried out, and the phase shift mask 200 was obtained (see FIG. 2(f)).

The manufactured half tone phase shift mask 200 of Example 1 was subjected to a mask pattern inspection by a mask inspection apparatus, and the presence of a black defect was confirmed on the phase shift pattern 2a of a location where a program defect was arranged. The black defect portion was subjected to EB defect repair. The repair rate ratio of the phase shift pattern 2a relative to the transparent substrate 1 was sufficiently high, and etching on the surface of the transparent substrate 1 could be minimized.

Next, a simulation of a transfer image was made when an exposure transfer was made on a resist film on a semiconductor device using AIMS193 (manufactured by Carl Zeiss) at an exposure light of wavelength 193 nm on the phase shift mask 200 of Example 1 after EB defect repair. The exposure transfer image of this simulation was inspected, and the design specification was sufficiently satisfied. Further, the transfer image of the portion subjected to an EB defect repair was at a comparable level to the transfer images of other regions. It can be understood from this result that when the phase shift mask 200 of Example 1 after an EB defect repair is set on a mask stage of an exposure apparatus and exposure-transferred on a resist film on a semiconductor device, a circuit pattern to be finally formed on the semiconductor device can be formed with high precision.

Comparative Example 1

Manufacture of Mask Blank

The mask blank of Comparative Example 1 was manufactured through the same procedure as the mask blank 100 of Example 1, except for a change in the condition of heat treatment on the phase shift film. Concretely, the phase shift film of Comparative Example 1 was subjected to heat treatment under the condition of 550° C. heating temperature and the processing time of one hour. Transmittance and phase difference of the phase shift film 2 after the heat treatment to wavelength of an ArF excimer laser light (about 193 nm) were measured using a phase shift measurement device (MPM-193 manufactured by Lasertec). The transmittance was 18.8% and the phase difference was 177.7 degrees. Further, optical characteristics of the phase shift film were measured similarly as the case of Example 1, and the refractive index n was 2.56, and the extinction coefficient k was 0.35 under the wavelength of 193 nm.

Similar to the case of Example 1, another phase shift film was formed on a main surface of another transparent substrate under the same film forming conditions as the phase shift film of Comparative Example 1, and further subjected to heat treatment under the same conditions. Next, the another transparent substrate and the phase shift film after the heat treatment were subjected to an X-ray photoelectron spectroscopy similar as Example 1.

Figure 5:
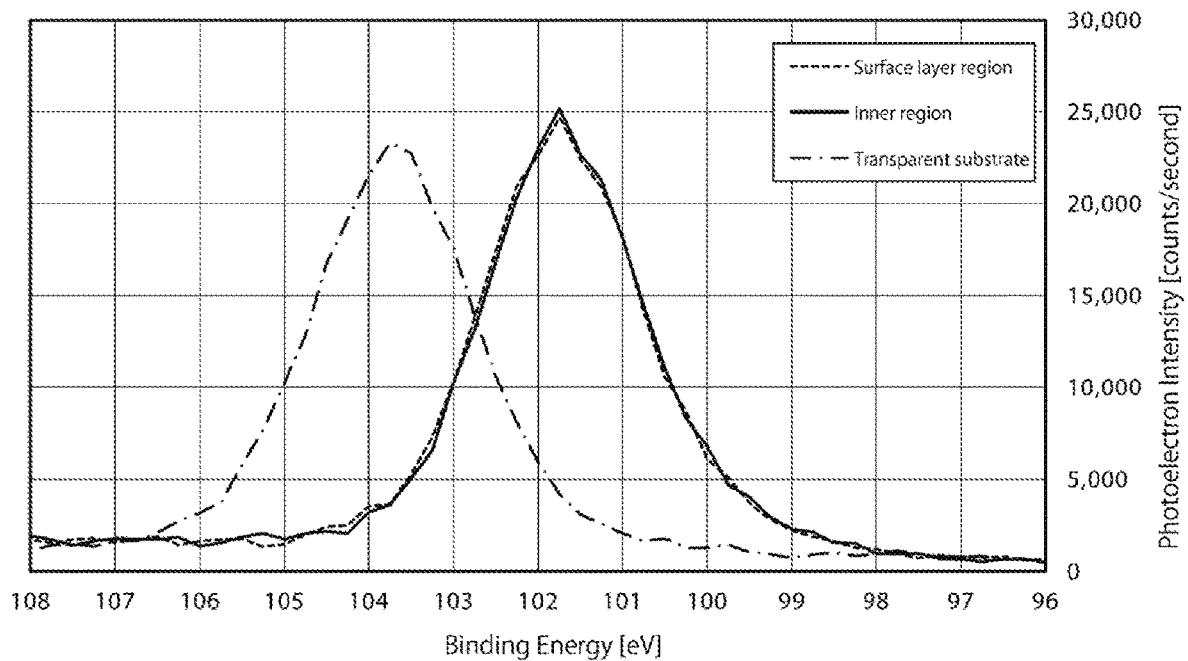
FIG. 5 shows a result of an X-ray photoelectron spectroscopy on a phase shift film and a transparent substrate of a mask blank according to Comparative Example 1 (Si2p narrow spectrum).

FIG. 5 shows each Si2p narrow spectrum of a surface layer region of the another phase shift film (measurement location at a depth of 4.9 nm from phase shift film surface), an inner region (measurement location at a depth of 47.6 nm from phase shift film surface), and the transparent substrate (measurement location at a depth of 16.1 nm from transparent substrate surface). Each Si2p narrow spectrum in FIG. 5 shows measurement locations having the greatest maximum peaks (PSi_fs, PSi_fi, PSi_sb) in all measurement locations measured in each of the surface layer region, the inner region, and the transparent substrate.

Figure 6:
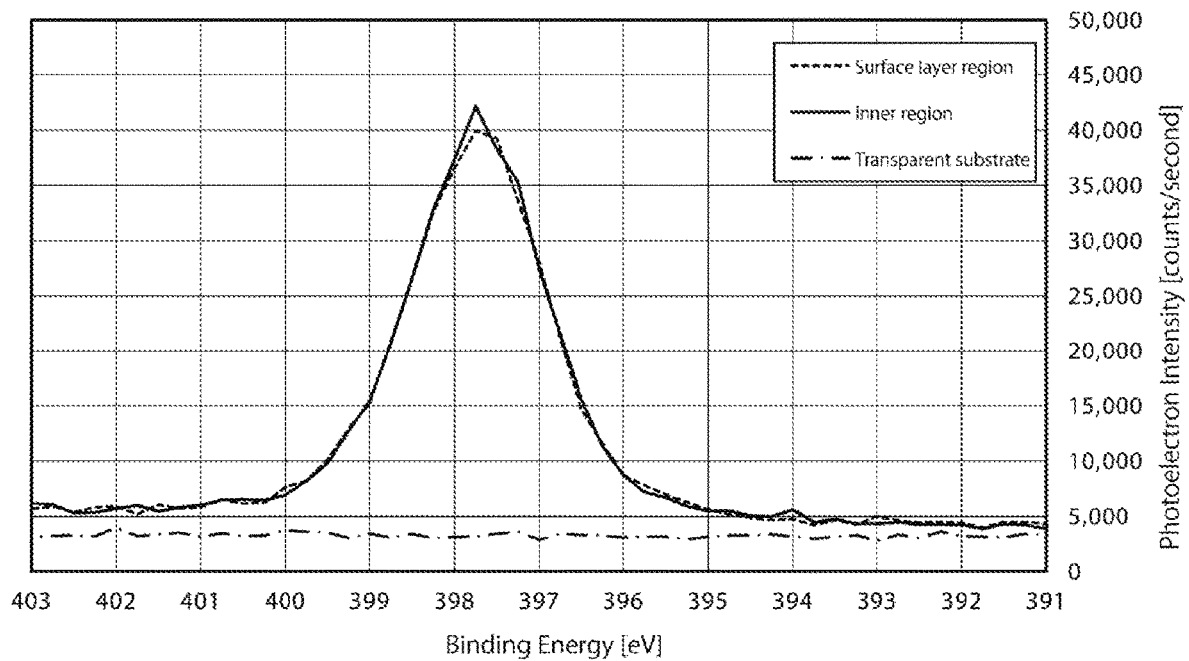
FIG. 6 shows a result of an X-ray photoelectron spectroscopy on a phase shift film and a transparent substrate of a mask blank according to Comparative Example 1 (N1s narrow spectrum).

FIG. 6 shows each N1s narrow spectrum in a surface layer region of the phase shift film (measurement location at a depth of 9.8 nm from phase shift film surface), an inner region (measurement location at a depth of 31.5 nm from phase shift film surface), and the transparent substrate (measurement location at a depth of 16.1 nm from phase shirt film surface). Each N1s narrow spectrum of FIG. 6 shows measurement locations having the greatest maximum peaks (PN_fs, PN_fi, PN_sb) in all measurement locations measured in each of the surface layer region, the inner region, and the transparent substrate.

Based on the result of this X-ray photoelectron spectroscopy, an average value PSi_fi_av of maximum peaks PSi_fi of Si2p narrow spectrum of the inner region of the phase shift film divided by an average value PSi_sb_av of maximum peaks PSi_sb of Si2p narrow spectrum of the transparent substrate (PSi_fi_av)/(PSi_sb_av) was calculated, and the value was 1.076. An average value PSi_fs_av of maximum peaks PSi_fs of Si2p narrow spectrum of the surface layer region of the phase shift film divided by an average value PSi_sb_av of maximum peaks PSi_sb of Si2p narrow spectrum of the transparent substrate (PSi_fs_av)/(PSi_sb_av) was calculated, and the value was 1.044. An average value PN_fs_av of maximum peaks PN_fs of N1s narrow spectrum of the surface layer region of the phase shift film was divided by an average value PN_fi_av of maximum peaks PN_fi of N1s narrow spectrum of the inner region of the phase shift film (PN_fs_av)/(PN_fi_av), and the value was 0.933.

Next, a light shielding film and a hard mask film were formed on the phase shift film of the transparent substrate, similarly as the case of Example 1. Through the above procedures, a mask blank of Comparative Example 1 having a structure where a phase shift film, a light shielding film, and a hard mask film are stacked on the transparent substrate was manufactured.

Manufacture of Phase Shift Mask

Next, a phase shift mask of Comparative Example 1 was manufactured using the mask blank of Comparative Example 1 through the same procedure as Example 1. The manufactured half tone phase shift mask of Comparative Example 1 was subjected to a mask pattern inspection by a mask inspection apparatus, and the presence of a black defect was confirmed on the phase shift pattern of a location where a program defect was arranged. The black defect portion was subjected to an EB defect repair, and an advancement of etching to a surface of the transparent substrate was observed, for the repair rate ratio between the phase shift pattern and the transparent substrate was low.

A simulation was made on a transfer image of the phase shift mask of Comparative Example 1 after an EB defect repair using AIMS 193 (manufactured by Carl Zeiss) on when exposure transfer was made on a resist film on a semiconductor device with an exposure light, of 193 nm wavelength. The exposure transfer image of this simulation was inspected, and the design specification was generally fully satisfied in portions other than those subjected to an EB defect repair. However, the transfer image of the portion subjected to an EB defect repair was at a level where a transfer defect will occur caused by influence on the transparent substrate by etching, etc. It can be understood from this result that when the phase shift mask of Comparative Example 1 after an EB defect repair was set on a mask stage of an exposure apparatus and exposure-transferred on a resist film on a semiconductor device, generation of short-circuit or disconnection of circuit pattern is expected on a circuit pattern to be finally formed on the semiconductor device.

DESCRIPTION OF REFERENCE NUMERALS 1 transparent substrate
2 phase shirt film
2a phase shift pattern
21 substrate vicinity region
22 inner region
23 surface layer region
3 light shielding film
3a, 3b light shielding pattern
4 hard mask film
4a hard mask pattern
5a first resist pattern
6b second resist pattern
100 mask blank
200 phase shift mask

The invention claimed is:

1. A mask blank comprising a thin film for forming a transfer pattern on a transparent substrate, wherein:
the thin film is made of a material containing silicon and nitrogen, and
in setting a plurality of measurement locations in a thickness direction of an inner region which is a region excluding a vicinity region of an interface of the thin film with the transparent substrate and a surface layer region opposite from the transparent substrate, conducting an X-ray photoelectron spectroscopy to acquire a maximum peak PSi_fi of photoelectron intensity of Si2p narrow spectrum for each of the plurality of measurement locations of the inner region, acquiring an average value PSi_fi_av of the maximum peaks PSi_fi that are each acquired, setting a plurality of measurement locations in the transparent substrate in a thickness direction, conducting an X-ray photoelectron spectroscopy to acquire a maximum peak PSi_sb of photoelectron intensity of Si2p narrow spectrum for the plurality of measurement locations of the transparent substrate, and acquiring an average value PSi_sb_av of the maximum peaks PSi_sb that are each acquired, the average value PSi_fi_av of the thin film divided by the average value PSi_sb_av of the transparent substrate (PSi_fi_av)/(PSi_sb_av) is 1.08 or more.

2. The mask blank according to claim 1 wherein:
in setting a plurality of measurement locations in the surface layer region in a thickness direction, conducting an X-ray photoelectron spectroscopy to acquire a maximum peak PSi_fs of photoelectron intensity of Si2p narrow spectrum for each of the plurality of measurement locations of the surface layer region, and acquiring an average value PSi_fs_av of the maximum peaks PSi_fs that are each acquired, the average value PSi_fs_av in the surface layer region divided by the average value PSi_sb_av of the transparent substrate (PSi_fs_av)/(PSi_sb_av) is 1.05 or more.

3. The mask blank according to claim 1, wherein:
in setting a plurality of measurement locations in the surface layer region in a thickness direction, conducting an X-ray photoelectron spectroscopy to acquire a maximum peak PN_fs of photoelectron intensity of N1s narrow spectrum for each of the plurality of measurement locations of the surface layer region, acquiring an average value PN_fs_av of the maximum peaks PN_fs that are each acquired, setting a plurality of measurement locations in the inner region in a thickness direction, conducting an X-ray photoelectron spectroscopy to acquire a maximum peak PN_fi of photoelectron intensity of N1s narrow spectrum for each of the plurality of measurement locations of the inner region, and acquiring an average value PN_fi_av of the maximum peaks PN_fi that are each acquired, the average value PN_fs_av in the surface layer region divided by the average value PN_fi_av of the thin film (PN_fs_av)/(PN_fi_av) is 0.98 or less.

4. The mask blank according to claim 1 wherein a nitrogen content in the inner region is 50 atom % or more.

5. The mask blank according to claim 1 wherein the surface layer region has more oxygen content than the inner region.

6. The mask blank according to any one of claim 1, wherein the maximum peak of photoelectron intensity of Si2p narrow spectrum is a maximum peak within a range of 96[eV] or more and 106[eV] or less binding energy.

7. The mask blank according to claim 3, wherein the maximum peak of photoelectron intensity of N1s narrow spectrum is a maximum peak within a range of 392[eV] or more and 402[eV] or less binding energy.

8. The mask blank according to claim 1, wherein an X-ray to be irradiated on the thin film in the X-ray photoelectron spectroscopy is an AlKα ray.

9. The mask blank according to claim 1, wherein the surface layer region is a region ranging from a surface opposite from the transparent substrate of the thin film up to a depth of 10 nm toward the transparent substrate.

10. The mask blank according to claim 1, wherein the vicinity region is a region ranging from an interface with the transparent substrate up to a depth of 10 nm toward the surface layer region.

11. The mask blank according claim 1 wherein the thin film is a phase shift film.

12. The mask blank according to claim 11, wherein the phase shift film has a function to transmit an exposure light of an ArF excimer laser at a transmittance of 10% or more, and a function to generate a phase difference of 150 degrees or more and 200 degrees or less between the exposure light transmitted through the phase shift film and the exposure light transmitted through air for a same distance as a thickness of the phase shift film.

13. A method of manufacturing a transfer mask using the mask blank according to claims 1, comprising the step of forming a transfer pattern in the thin film by dry etching.

14. A transfer mask comprising a thin film having a transfer pattern on a transparent substrate, wherein:
the thin film is made of a material containing silicon and nitrogen, and
in setting a plurality of measurement locations in a thickness direction of an inner region which is a region excluding a vicinity region of an interface of the thin film with the transparent substrate and a surface layer region opposite from the transparent substrate, conducting an X-ray photoelectron spectroscopy to acquire a maximum peak PSi_fi of photoelectron intensity of Si2p narrow spectrum for each of the plurality of measurement locations of the inner region, acquiring an average value PSi_fi_av of the maximum peaks PSi_fi that are each acquired, setting a plurality of measurement locations in the transparent substrate in a thickness direction, conducting an X-ray photoelectron spectroscopy to acquire a maximum peak PSi_sb of photoelectron intensity of Si2p narrow spectrum for each of the plurality of measurement locations of the transparent substrate, and acquiring an average value PSi_sb_av of the maximum peaks PSi_sb that are each acquired, the average value PSi_fi_av of the thin film divided by the average value PSi_sb_av of the transparent substrate (PSi_fi_av)/(PSi_sb_av) is 1.08 or more.

15. The transfer mask according to claim 14, wherein:
in setting a plurality of measurement locations in the surface layer region in a thickness direction, conducting an X-ray photoelectron spectroscopy to acquire a maximum peak PSi_fs of photoelectron intensity of Si2p narrow spectrum for each of the plurality of measurement locations of the surface layer region, and acquiring an average value PSi_fs_av of the maximum peaks PSi_fs that are each acquired, the average value PSi_fs_av in the surface layer region divided by the average value PSi_sb_av of the transparent substrate (PSi_fs_av)/(PSi_sb_av) is 1.05 or more.

16. The transfer mask according to claim 14, wherein:
in setting a plurality of measurement locations in the surface layer region in a thickness direction, conducting an X-ray photoelectron spectroscopy to acquire a maximum peak PN_fs of photoelectron intensity of N1s narrow spectrum for each of the plurality of measurement locations of the surface layer region, acquiring an average value PN_fs_av of the maximum peaks PN_fs that are each acquired, setting a plurality of measurement locations in the inner region in a thickness direction, conducting an X-ray photoelectron spectroscopy to acquire a maximum peak PN_fi of photoelectron intensity of N1s narrow spectrum for each of the plurality of measurement locations of the inner region, and acquiring an average value PN_fi_av of the maximum peaks PN_fi that are each acquired, the average value PN_fs_av in the surface layer region divided by the average value PN_fi_av of the thin film (PN_fs_av)/(PN_fi_av) is 0.98 or less.

17. The transfer mask according to claim 14 wherein a nitrogen content in the inner region is 50 atom % or more.

18. The transfer mask according to claim 14 wherein the surface layer region has more oxygen content than the inner region.

19. The transfer mask according to claim 14, wherein the maximum peak of photoelectron intensity of Si2p narrow spectrum is a maximum peak within a range of 96[eV] or more and 106[eV] or less binding energy.

20. The transfer mask according to claim 16, wherein the maximum peak of photoelectron intensity of N1s narrow spectrum is a maximum peak within a range of 392[eV] or more and 402[eV] or less binding energy.

21. The transfer mask according to claim 14, wherein an X-ray irradiated on the thin film in the X-ray photoelectron spectroscopy is an AlKα ray.

22. The transfer mask according to claim 14, wherein the surface layer region is a region ranging from a surface opposite from the transparent substrate of the thin film up to a depth of 10 nm toward the transparent substrate.

23. The transfer mask according to claim 14, wherein the vicinity region is a region ranging from an interface with the transparent substrate up to a depth of 10 nm toward the surface layer region.

24. The transfer mask according to claim 14 wherein the thin film is a phase shift film.

25. The transfer mask according to claim 24, wherein the phase shift film has a function to transmit an exposure light of an ArF excimer laser at a transmittance of 10% or more, and a function to generate a phase difference of 150 degrees or more and 200 degrees or less between the exposure light transmitted through the phase shift film and the exposure light transmitted through air for a same distance as a thickness of the phase shift film.

26. A method of manufacturing a semiconductor device comprising the step of exposure-transferring a transfer pattern in a resist film on a semiconductor substrate using the transfer mask manufactured by the method of manufacturing a transfer mask according to claim 13.

27. A method of manufacturing a semiconductor device comprising the step of exposure-transferring a transfer pattern in a resist film on a semiconductor substrate using the transfer mask according to claim 14.

* * * * *